(12) United States Patent
Amano et al.

(10) Patent No.: US 11,637,038 B2
(45) Date of Patent: Apr. 25, 2023

(54) THREE-DIMENSIONAL MEMORY DEVICE CONTAINING SELF-ALIGNED LATERAL CONTACT ELEMENTS AND METHODS FOR FORMING THE SAME

(71) Applicant: SANDISK TECHNOLOGIES LLC, Addison, TX (US)

(72) Inventors: Fumitaka Amano, Yokkaichi (JP); Yuji Totoki, Yokkaichi (JP); Shunsuke Takuma, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 102 days.

(21) Appl. No.: 17/153,972

(22) Filed: Jan. 21, 2021

(65) Prior Publication Data

US 2022/0230917 A1    Jul. 21, 2022

(51) Int. Cl.

| | |
|---|---|
| *H01L 21/768* | (2006.01) |
| *H01L 23/522* | (2006.01) |
| *H01L 23/528* | (2006.01) |
| *H01L 23/535* | (2006.01) |
| *H01L 27/11582* | (2017.01) |
| *H01L 27/11556* | (2017.01) |

(52) U.S. Cl.
CPC .. *H01L 21/76897* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/5283* (2013.01); *H01L 23/535* (2013.01); *H01L 27/11556* (2013.01); *H01L 27/11582* (2013.01)

(58) Field of Classification Search
CPC .................. H01L 27/11582; H01L 23/5226
See application file for complete search history.

(56) References Cited

U.S. PATENT DOCUMENTS

| | | | |
|---|---|---|---|
| 8,658,499 | B2 | 2/2014 | Makala et al. |
| 9,875,929 | B1 | 1/2018 | Shukla et al. |
| 10,192,784 | B1 | 1/2019 | Cui et al. |

(Continued)

OTHER PUBLICATIONS

R. Clark et al., "Perspective: New process technologies required for future devices and scaling" APL Materials 6, 058203 (2018); doi: 10.1063/1.5026805, 14 pages.

(Continued)

*Primary Examiner* — Farun Lu
(74) *Attorney, Agent, or Firm* — The Marbury Law Group PLLC

(57) ABSTRACT

A three-dimensional memory device includes an alternating stack of insulating layers and electrically conductive layers having stepped surfaces, memory stack structures extending through the alternating stack, a retro-stepped dielectric material portion overlying the stepped surfaces, and pillar-shaped contact-opening assemblies located within a respective pillar-shaped volume vertically extending through the retro-stepped dielectric material portion and a region of the alternating stack that underlies the retro-stepped dielectric material portion. Some of the pillar-shaped contact-opening assemblies can include a first conductive plug that laterally contacts a cylindrical sidewall of a respective one of the electrically conductive layers and a conductive via structure that contacts a top surface of the first conductive plug.

9 Claims, 28 Drawing Sheets

(56) References Cited

U.S. PATENT DOCUMENTS

| | | |
|---|---|---|
| 10,256,247 B1 | 4/2019 | Kanakamedala et al. |
| 10,290,648 B1 | 5/2019 | Zhou et al. |
| 10,304,852 B1 | 5/2019 | Cui et al. |
| 10,319,680 B1 | 6/2019 | Sei et al. |
| 10,347,654 B1 | 7/2019 | Iwai et al. |
| 10,700,078 B1 | 6/2020 | Cui et al. |
| 10,700,090 B1 | 6/2020 | Cui et al. |
| 2016/0268291 A1* | 9/2016 | Ishimura ........... H01L 27/11575 |
| 2019/0252396 A1 | 8/2019 | Mushiga et al. |
| 2019/0252403 A1 | 8/2019 | Kaminaga et al. |
| 2020/0035694 A1 | 1/2020 | Kaminaga |

OTHER PUBLICATIONS

Takashi Yunogami, "The trend in the semiconductor industry is clearly "three-dimensional" VLAI 2019 (2.4)", EE Times, Japan, Semiconductor Devices, 10 pages, retrieved from: https://eetimes.jp/ee/articles/1906/20/news037_2.html.

Endoh et al., "Novel Ultra High Density Memory with a Stacked-Surrounding Gate Transistor (S-SGT) Structured Cell," IEDM Proc. (2001) 33-36.

U.S. Appl. No. 16/916,476, filed Jun. 30, 2020, SanDisk Technologies LLC.
U.S. Appl. No. 16/900,060, filed Jun. 12, 2020, SanDisk Technologies LLC.
U.S. Appl. No. 16/893,955, filed Jun. 5, 2020, SanDisk Technologies LLC.
U.S. Appl. No. 16/952,526, filed Nov. 19, 2020, SanDisk Technologies LLC.
U.S. Appl. No. 16/295,292, filed Mar. 7, 2019, SanDisk Technologies LLC.
U.S. Appl. No. 16/353,048, filed Mar. 14, 2019, SanDisk Technologies LLC.
U.S. Appl. No. 16/362,857, filed Mar. 25, 2019, SanDisk Technologies LLC.
U.S. Appl. No. 16/362,895, filed Mar. 25, 2019, SanDisk Technologies LLC.
U.S. Appl. No. 16/366,245, filed Mar. 27, 2019, SanDisk Technologies LLC.
U.S. Appl. No. 16/366,330, filed Mar. 27, 2019, SanDisk Technologies LLC.
U.S. Appl. No. 16/722,745, filed Dec. 20, 2019, SanDisk Technologies LLC.
U.S. Appl. No. 16/722,824, filed Dec. 20, 2019, SanDisk Technologies LLC.
U.S. Appl. No. 16/735,854, filed Jan. 7, 2020, SanDisk Technologies LLC.
U.S. Appl. No. 16/801,456, filed Feb. 26, 2020, SanDisk Technologies LLC.
U.S. Appl. No. 16/809,861, filed Mar. 5, 2020, SanDisk Technologies LLC.
U.S. Appl. No. 16/893,933, filed Jun. 5, 2020, SanDisk Technologies LLC.
U.S. Appl. No. 17/001,003, filed Aug. 24, 2020, SanDisk Technologies LLC.

* cited by examiner

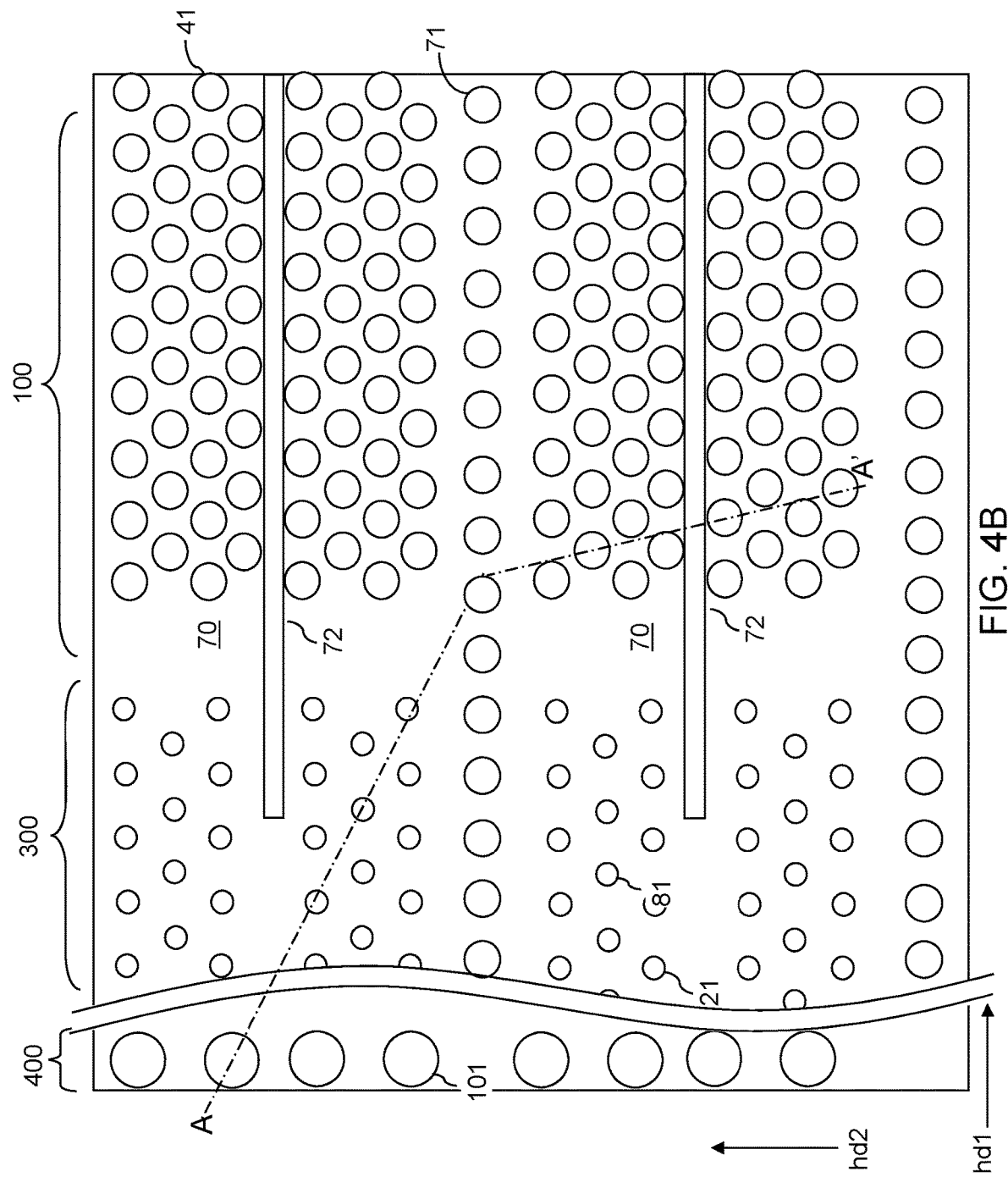

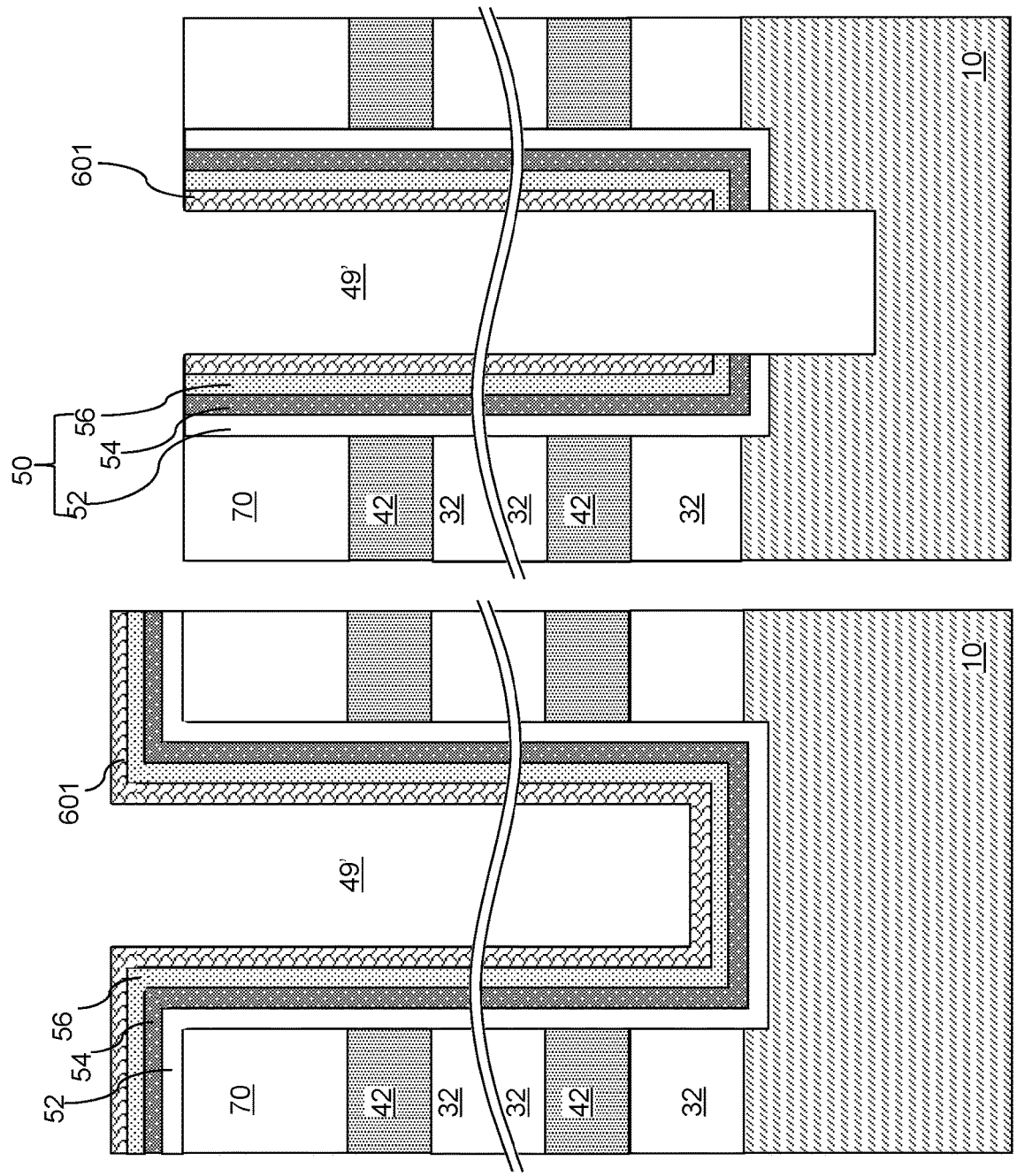

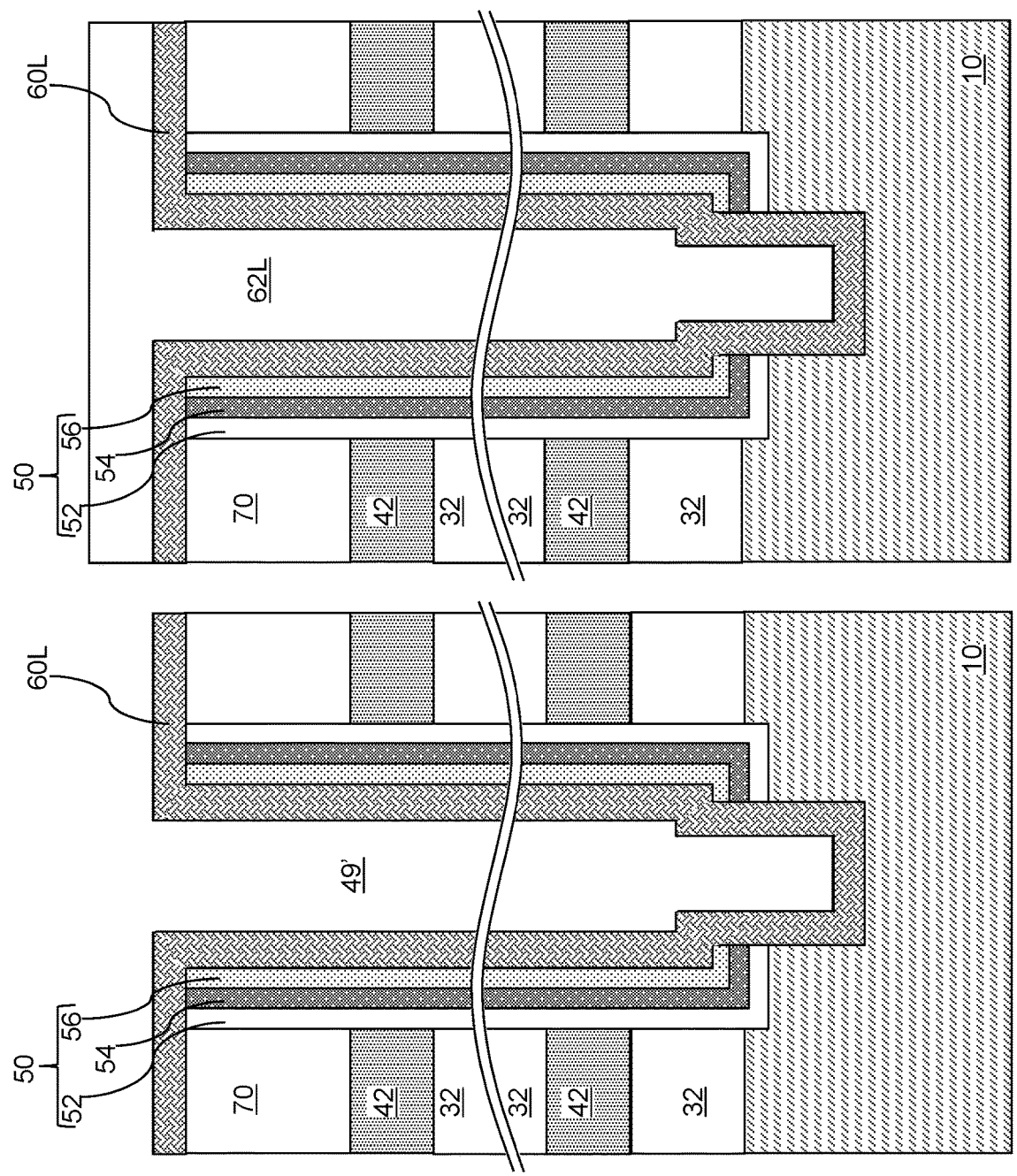

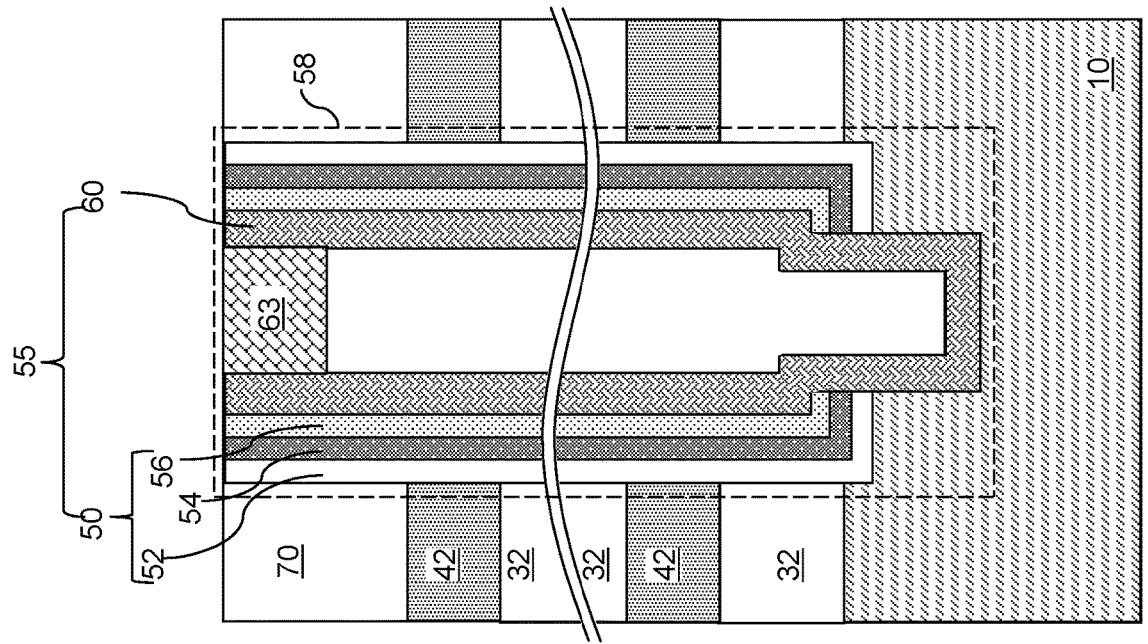
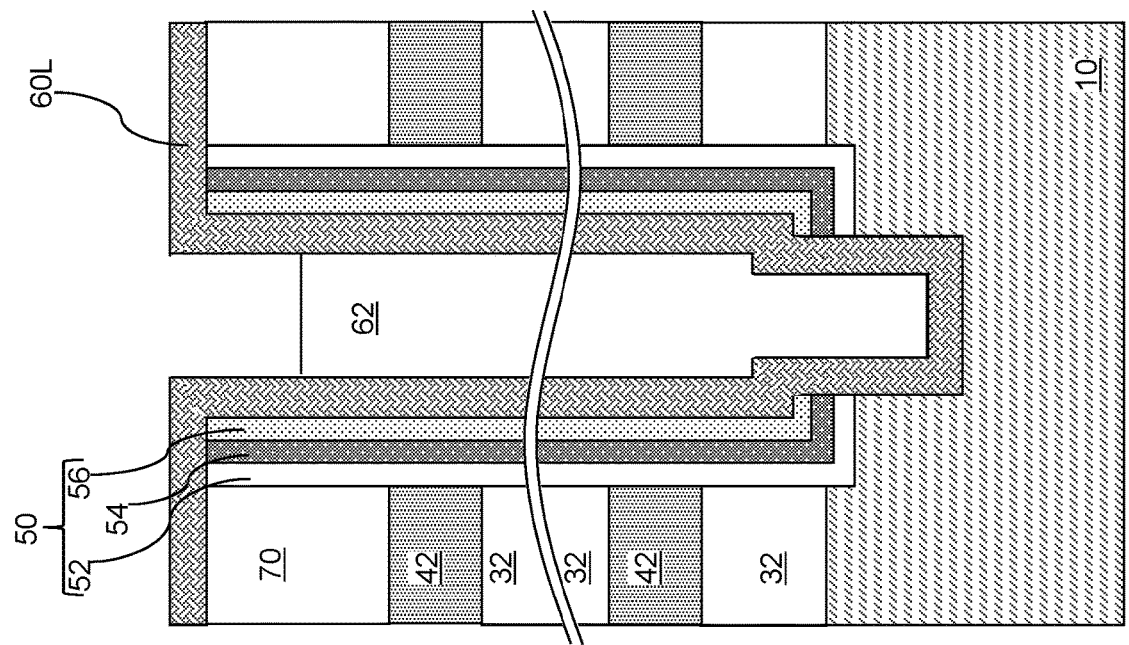

THREE-DIMENSIONAL MEMORY DEVICE CONTAINING SELF-ALIGNED LATERAL CONTACT ELEMENTS AND METHODS FOR FORMING THE SAME

FIELD

The present disclosure relates generally to the field of semiconductor devices, and particular to a three-dimensional memory device containing self-aligned lateral contact elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers having stepped surfaces; memory stack structures extending through the alternating stack, wherein each of the memory stack structures comprises a vertical semiconductor channel and a vertical stack of memory elements; a retro-stepped dielectric material portion overlying the stepped surfaces; and pillar-shaped contact-opening assemblies located within a respective pillar-shaped volume vertically extending through the retro-stepped dielectric material portion and a region of the alternating stack that underlies the retro-stepped dielectric material portion, wherein a first one of the pillar-shaped contact-opening assemblies comprises a first conductive plug that laterally contacts a cylindrical sidewall of one of the electrically conductive layers and a conductive via structure that contacts a top surface of the first conductive plug and vertically extends at least to a horizontal plane including a top surface of the retro-stepped dielectric material portion.

According to another aspect of the present disclosure, a method of forming a three-dimensional memory device is provided, which comprises: forming an alternating stack of insulating layers and sacrificial material layers over a substrate; forming stepped surfaces by patterning the alternating stack; forming a retro-stepped dielectric material portion over the stepped surfaces; forming memory openings and contact openings through the alternating stack in a common first etching step; forming sacrificial contact opening fill structures in the contact openings; replacing the sacrificial material layers with electrically conductive layers; forming contact cavities by removing the sacrificial contact opening fill structures selective to the insulating layers and the electrically conductive layers; forming conductive plugs by selectively depositing a conductive material from physically exposed cylindrical surfaces of the electrically conductive layers while suppressing deposition of the conductive material from dielectric surfaces; forming conductive via structures on a respective one of the conductive plugs; and forming memory opening fill structures in the memory openings, wherein each of the memory opening fill structures comprises a vertical semiconductor channel and a vertical stack of memory elements.

BRIEF DESCRIPTION OF THE DRAWINGS

FIG. 4B is a top-down view of the exemplary structure of FIG. 4A. The vertical plane A-A' is the plane of the cross-section for FIG. 4A.

FIGS. 19A-19G are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
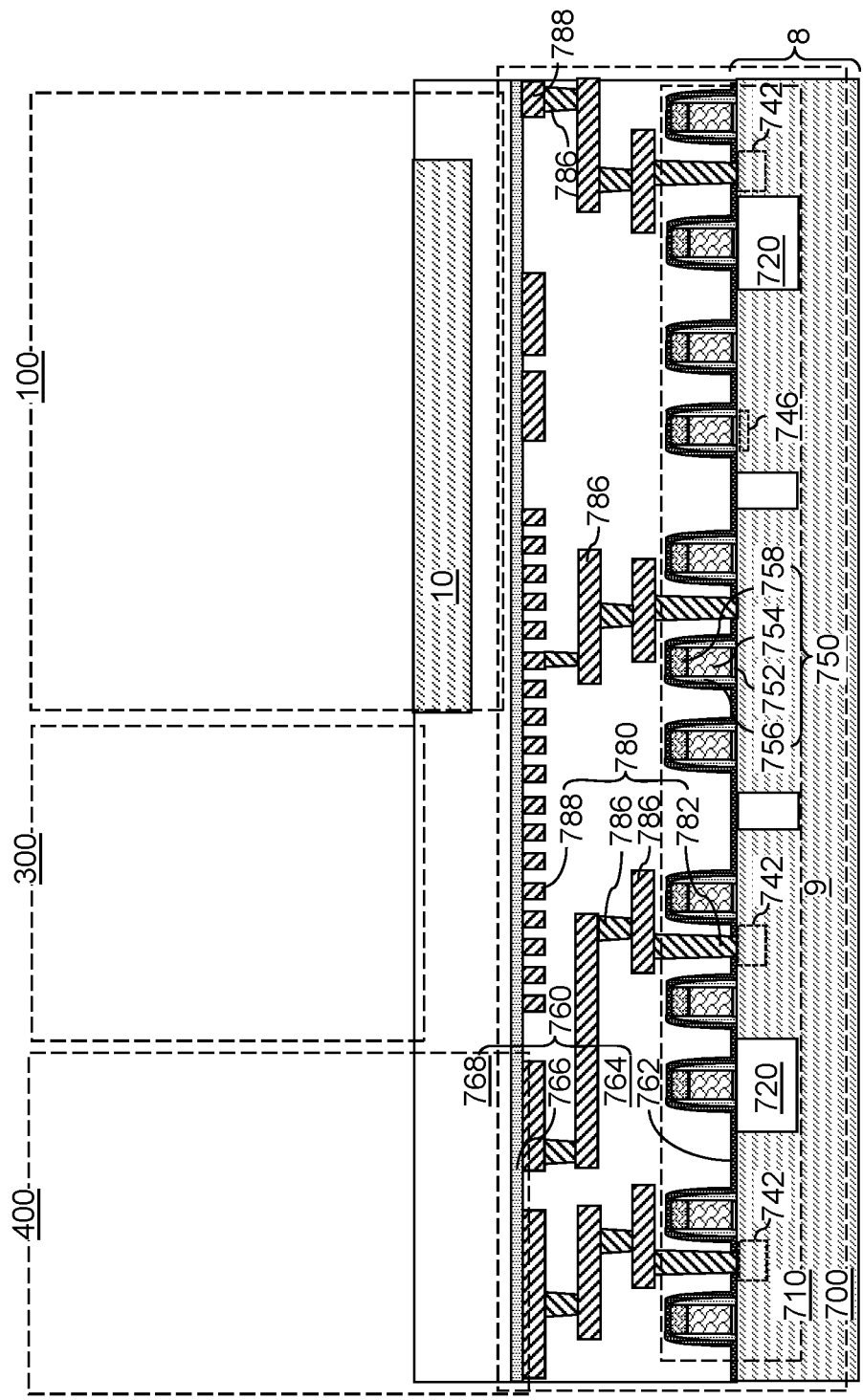
FIG. 1 is a vertical cross-sectional view of an exemplary structure after formation of semiconductor devices, lower-level dielectric material layers, lower-level metal interconnect structures, and in-process source level material layers on a semiconductor substrate according to an embodiment of the present disclosure.

As discussed above, the present disclosure is directed to a three-dimensional memory device containing self-aligned lateral contact elements and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated. The exemplary structure includes a substrate 8 and optionally semiconductor devices 710 formed thereupon. The substrate 8 may comprise a semiconductor substrate, such as a silicon wafer, and may include a substrate semiconductor layer 9 at least at an upper portion thereof. The substrate semiconductor layer 9 may comprise a doped semiconductor well in the substrate 8 and/or a semiconductor layer 8 deposited over the substrate 8.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one second material layer 768 may comprise, or consist essentially of, dielectric material layers having dielectric constants that do not exceed the dielectric constant of undoped silicate glass (silicon oxide) of 3.9.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

A layer of a semiconductor material may be deposited over, or within patterned recesses of, the at least one second dielectric material layer 768, and is lithographically patterned to provide a patterned semiconductor material layer 10 in a memory array region 100, which is a region in which a three-dimensional memory array is subsequently formed. The patterned semiconductor material layer 10 can include a semiconductor material having a doping of a first conductivity type, which may be p-type or n-type. The atomic concentration of dopants of the first conductivity type in the patterned semiconductor material layer 10 can be in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations may also be employed. In one embodiment, the patterned semiconductor material layer 10 may have a thickness in a range from 100 nm to 2,000 nm, although lesser and greater thicknesses may also be employed.

A staircase region 300 in which stepped surfaces of electrically conductive layers are subsequently formed can be provided adjacent to the memory array region 100. A peripheral region 400 may be provided adjacent to the staircase region 300.

In one alternative embodiment, the peripheral device region 700 containing the at least one semiconductor device 710 for the peripheral circuitry may be located on a separate substrate which is subsequently bonded with the substrate 8 containing memory devices. In another alternative embodiment, the peripheral device region 700 containing the at least one semiconductor device 710 for the peripheral circuitry may be located laterally adjacent to (e.g., next to) to the memory array region 100.

Figure 2:
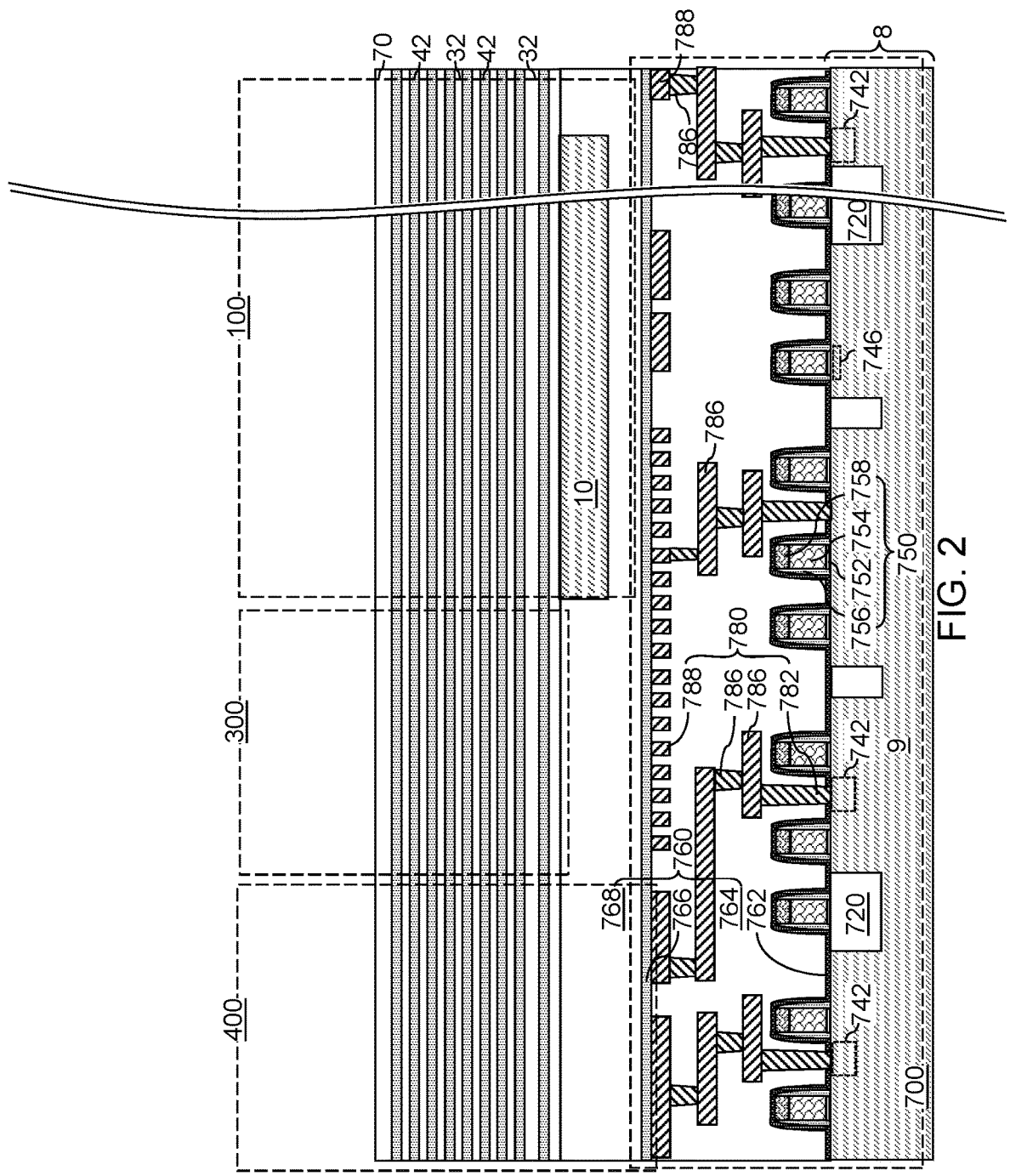
FIG. 2 is a vertical cross-sectional view of the exemplary structure after formation of an alternating stack of insulating layers and sacrificial material layers according to an embodiment of the present disclosure.

Referring to FIG. 2, an alternating stack of first material layers and second material layers is subsequently formed. Each first material layer may include a first material, and each second material layer may include a second material that is different from the material. The alternating stack may include insulating layers 32 as the first material layers, and spacer material layers as the second material layers. In one embodiment, the spacer material layers may be sacrificial material layers that are subsequently replaced with electrically conductive layers. In another embodiment, the spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be insulating layers 32 and sacrificial material layers 42, respectively. In one embodiment, each insulating layer 32 may include an insulating material, and each sacrificial material layer 42 may include a sacrificial material. An alternating plurality of insulating layers 32 and sacrificial material layers 42 is formed over the patterned semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating stack (32, 42) may include insulating layers 32 composed of the first material, and sacrificial material layers 42 composed of the second material, which is different from the first material. The first material of the insulating layers 32 may be at least one insulating material. Insulating materials that may be used for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the material at a rate that is at least twice the rate of removal of the second material. The ratio of the rate of removal of the first material to the rate of removal of the second material is herein referred to as a "selectivity" of the removal process for the material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. In one embodiment, the sacrificial material layers 42 may be material layers that comprise silicon nitride.

In one embodiment, the insulating layers 32 may include silicon oxide, and sacrificial material layers may include silicon nitride sacrificial material layers. The material of the insulating layers 32 may be deposited, for example, by chemical vapor deposition (CVD). For example, if silicon oxide is used for the insulating layers 32, tetraethylorthosilicate (TEOS) may be used as the precursor material for the CVD process. The second material of the sacrificial material layers 42 may be formed, for example, CVD or atomic layer deposition (ALD).

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer 42 may be in a range from 2 to 1,024, and typically from 8 to 256, although a greater number of repetitions may also be used. In one embodiment, each sacrificial material layer 42 in the alternating stack (32, 42) may have a uniform thickness that is substantially invariant within each respective sacrificial material layer 42.

An insulating cap layer 70 is subsequently formed over the alternating stack (32, 42). The insulating cap layer 70 includes a dielectric material, which may be any dielectric material that may be used for the insulating layers 32. In one embodiment, the insulating cap layer 70 includes the same dielectric material as the insulating layers 32. The thickness of the insulating cap layer 70 may be in a range from 20 nm to 300 nm, although lesser and greater thicknesses may also be used.

Figure 3A:
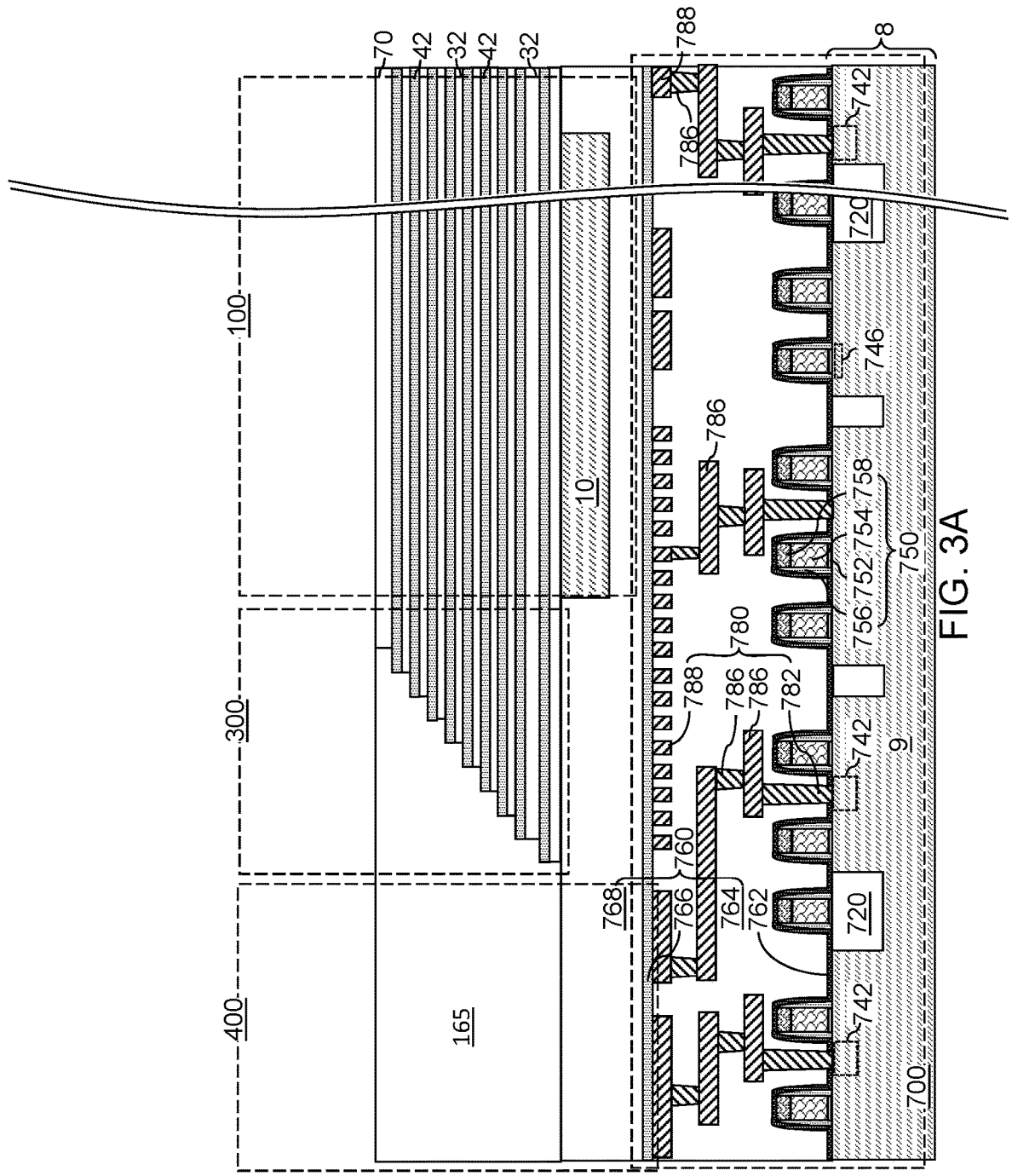
FIG. 3A is a vertical cross-sectional view of the exemplary structure after formation of stepped surfaces and a retro-stepped dielectric material portion according to an embodiment of the present disclosure.
Figure 3B:
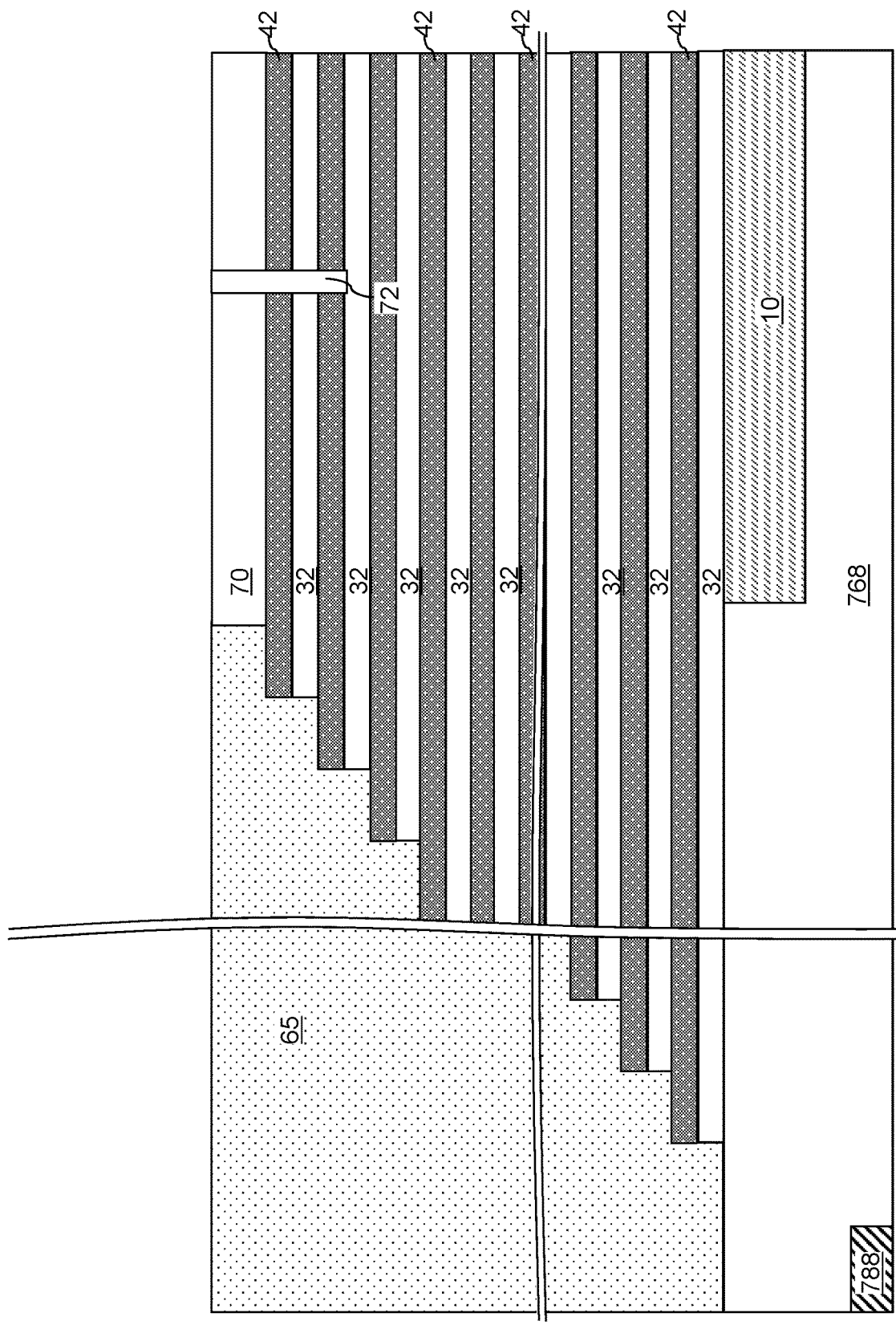
FIG. 3B is a vertical cross-sectional view of an upper region of the exemplary structure of FIG. 3A.

Referring to FIGS. 3A and 3B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 700 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

Figure 4A:
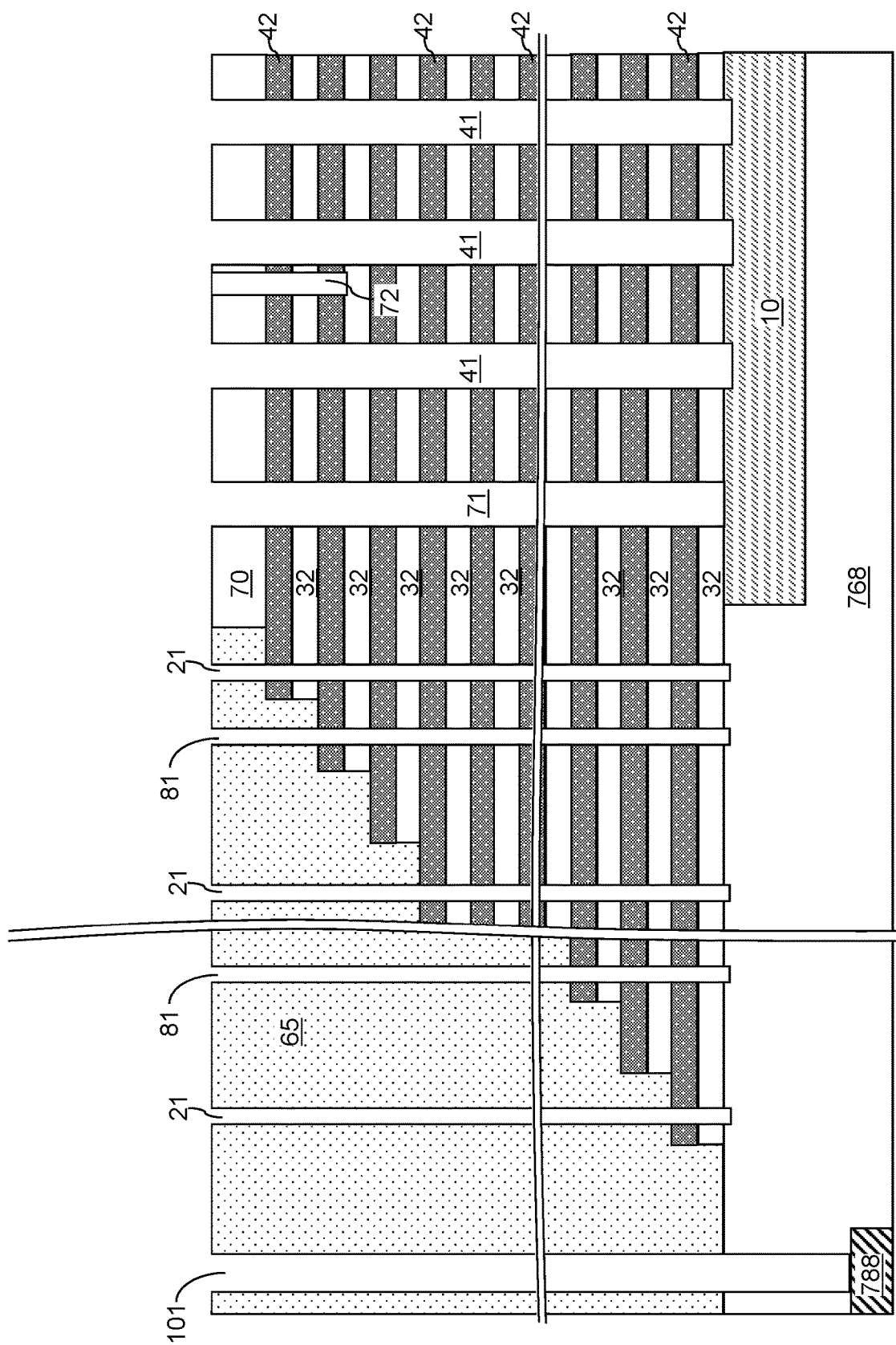
FIG. 4A is a vertical cross-sectional view of the exemplary structure after formation of memory openings, support openings, contact openings, backside openings, and through-memory-level via openings according to an embodiment of the present disclosure.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The pattern of openings in the lithographic material stack can be transferred through the insulating cap layer 70, the retro-stepped dielectric material portion 65, and through the alternating stack (32, 42) and into an upper portion of the semiconductor material layer 10 or the and at least one second dielectric layer 768 by an anisotropic etch process.

Various openings (41, 21, 81, 71, 101) are formed through the insulating cap layer 70, the retro-stepped dielectric material portion 65, and/or through the alternating stack (32, 42) and into an upper portion of the semiconductor material layer 10 or the and at least one second dielectric layer 768 by a same anisotropic etch process (which may be referred to as a common first etch step). The various openings (41, 21, 81, 71, 101) include memory openings 41 that are formed in the memory array region 100, support openings 21 and contact openings 81 that are formed in the staircase region 300, backside openings 71 that are formed in a respective row that laterally extend along the first horizontal direction hd1 across the memory array region 100 and the staircase region 300, and through-memory-level via openings 101 that are formed in the peripheral region 400. The through-memory-level via openings 101 may also be formed in the memory array region 100.

The memory openings 49 are formed as clusters located between a respective neighboring pair of rows of backside openings 71 within the memory array region 100. As used herein, a "memory opening" refers to a structure in which memory elements, such as a memory stack structure (e.g., vertical channel and memory film), is subsequently formed. As used herein, a "support opening" refers to a structure in which a support structure (such as a support pillar structure) that mechanically supports other elements is subsequently formed. The memory openings 41 are formed through the insulating cap layer 70 and the entirety of the alternating stack (32, 42) in the memory array region 100.

The support openings 21 and the contact openings 81 can be formed in the staircase region 300. The support openings 21 and the contact openings 81 vertically extend through the retro-stepped dielectric material portion 65 and underlying portions of the alternating stack (32, 42). In one embodiment, the support openings 21 and the contact openings 81 can vertically extend into the at least one second dielectric layer 768. The locations of the support openings 21 and the contact openings 81 can be selected such that surfaces of the semiconductor material layer 10 or the lower-level metal interconnect structures 780 are not physically exposed to the support openings 21 or the contact openings 81.

The backside openings 71 are formed as discrete openings that are arranged in rows that laterally extend along the first horizontal direction (e.g., word line direction) hd1, as shown in FIG. 4B. Rows of the backside openings 71 can be laterally spaced from each other along a second horizontal direction (e.g., bit line direction) hd2 that is perpendicular to the first horizontal direction hd1.

The through-memory-level via openings 101 are formed in the peripheral region 400. The through-memory-level via openings 101 can vertically extend to a top surface of a respective one of the landing-pad-level metal line structures 788. In one embodiment, the lateral dimensions of the through-memory-level via openings 101 may be greater than the lateral dimensions of the support openings 21 and the contact openings 81 to provide a greater etch depth. Optionally, additional through-memory-level via openings 101 may be formed in the memory array region 100 between clusters of the memory openings 41. Such additional through-memory-level via openings 101 may extend through the semiconductor material layer 10 to expose a respective one of the landing-pad-level metal line structures 788 located under the semiconductor material layer 10 in the memory array region 1000. The lithographic material stack can be subsequently removed, for example, by ashing.

Generally, each of the contact openings 81 and the support openings 21 may vertically extend at least from a horizontal plane including a top surface of the retro-stepped dielectric material portion 65 into an underlying material layer (such as the at least one second dielectric layer 768) that underlies the alternating stack (32, 42). The backside openings 71 are arranged along the first horizontal direction. The through-memory-level via openings 101 are formed through the retro-stepped dielectric material portion 65 or through the alternating stack (32, 42) down to a respective one of the lower-level metal interconnect structures 780 in an area in which the semiconductor material layer 10 is not present, such as an opening through the semiconductor material layer 10.

Figure 5A:
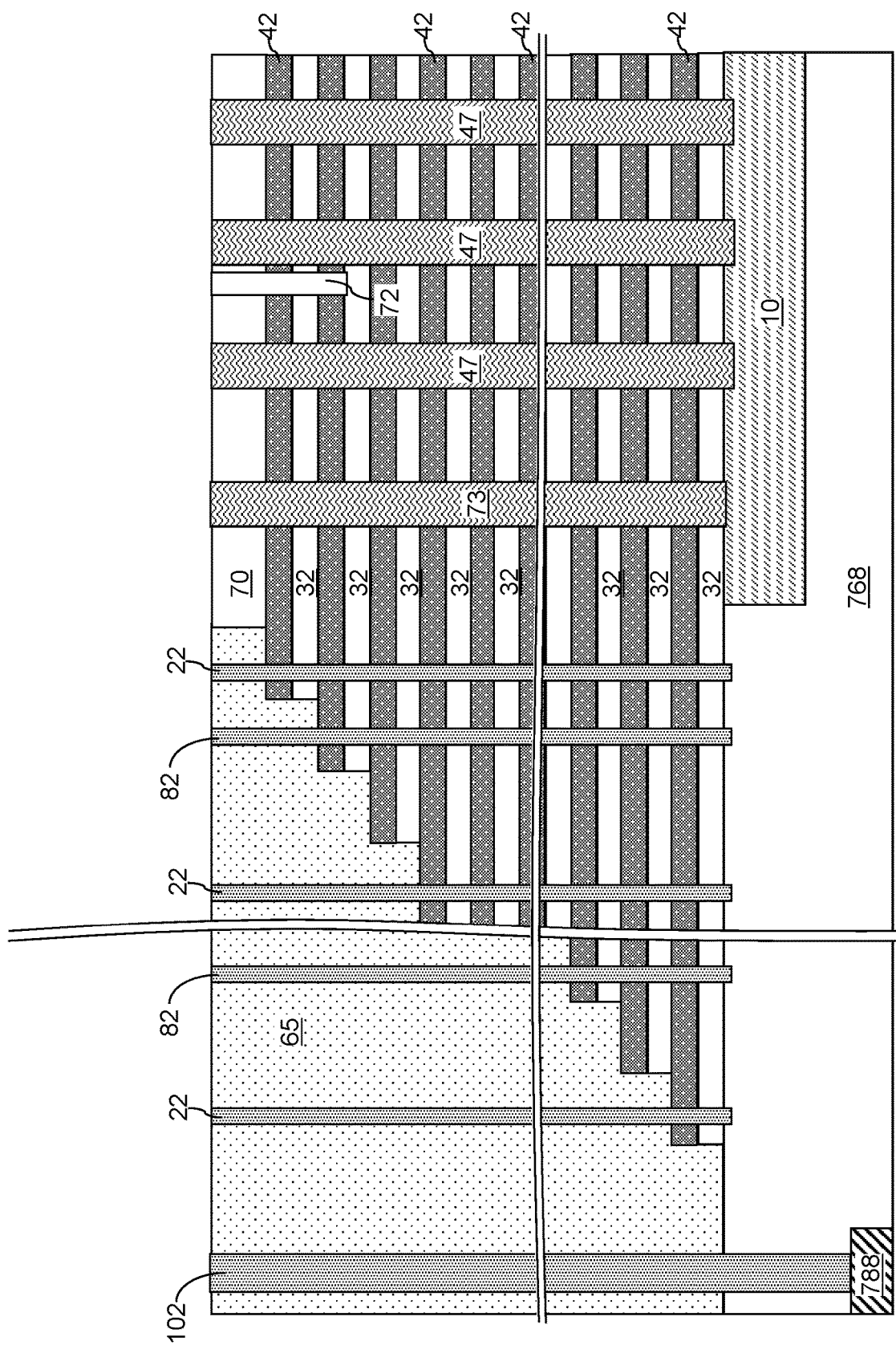
FIG. 5A is a vertical cross-sectional view of the exemplary structure after formation of sacrificial memory opening fill structures, sacrificial support opening fill structures, sacrificial contact opening fill structures, sacrificial backside opening fill structures, and sacrificial through-memory-level via structures according to an embodiment of the present disclosure.
Figure 5B:
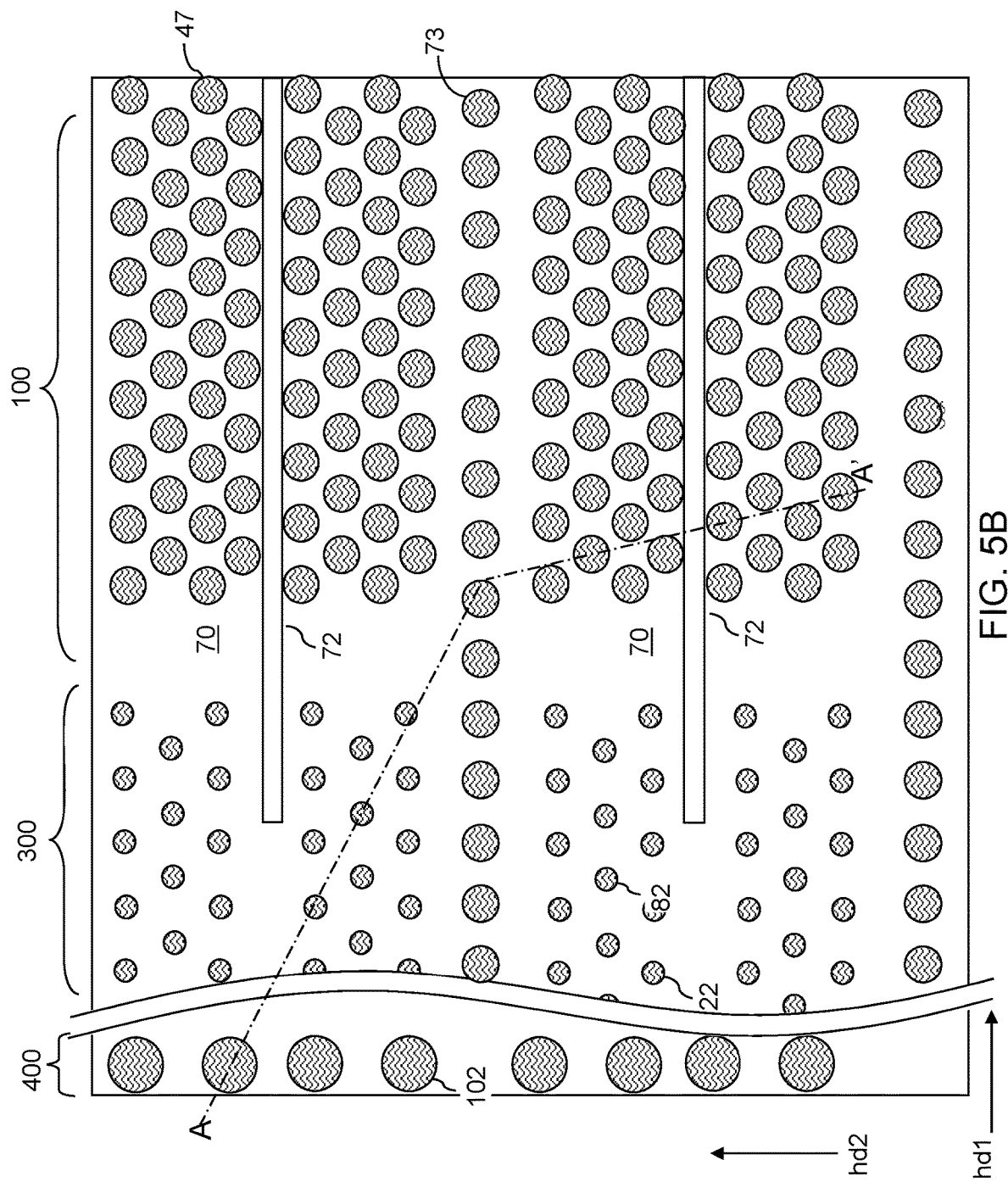
FIG. 5B is a top-down view of the exemplary structure of FIG. 5A. The vertical plane A-A' is the plane of the cross-section for FIG. 5A.

Referring to FIGS. 5A and 5B, a sacrificial fill material can be deposited in the various openings (41, 21, 81, 71, 101). The sacrificial fill material can include any material that can be removed selective to materials of the insulating layers 32, the sacrificial material layers 42, the insulating cap layer 70, the semiconductor material layer 10, the retro-stepped dielectric material portion 65, the at least one second dielectric layer 768, and the landing-pad-level metal line structures 788. For example, the sacrificial fill material may include a semiconductor material such as amorphous silicon, silicon-germanium or germanium, a carbon-based material such as amorphous carbon or diamond-like carbon (DLC), a dielectric material such as borosilicate glass or organosilicate glass, or a silicon-based polymer material.

Excess portions of the sacrificial fill material can be removed from above the horizontal plane including the top surfaces of the insulating cap layer 70 and the retro-stepped dielectric material portion 65. Remaining portions of the sacrificial fill material include various sacrificial fill structures (47, 22, 82, 73, 102). The various sacrificial fill structures (47, 22, 82, 73, 102) include sacrificial memory opening fill structures 47 that are formed in memory openings 41, sacrificial support opening fill structures 22 that are formed in the support openings 21, sacrificial contact opening fill structures 82 that are formed in the contact openings 81, sacrificial backside opening fill structures 73 that are formed in the backside openings 71, and sacrificial through-memory-level via structures 102 that are formed in the through-memory-level via openings 101. The various sacrificial fill structures (47, 22, 82, 73, 102) are formed simultaneously by depositing the sacrificial fill material and removing excess portions of the sacrificial fill material.

Figure 6:
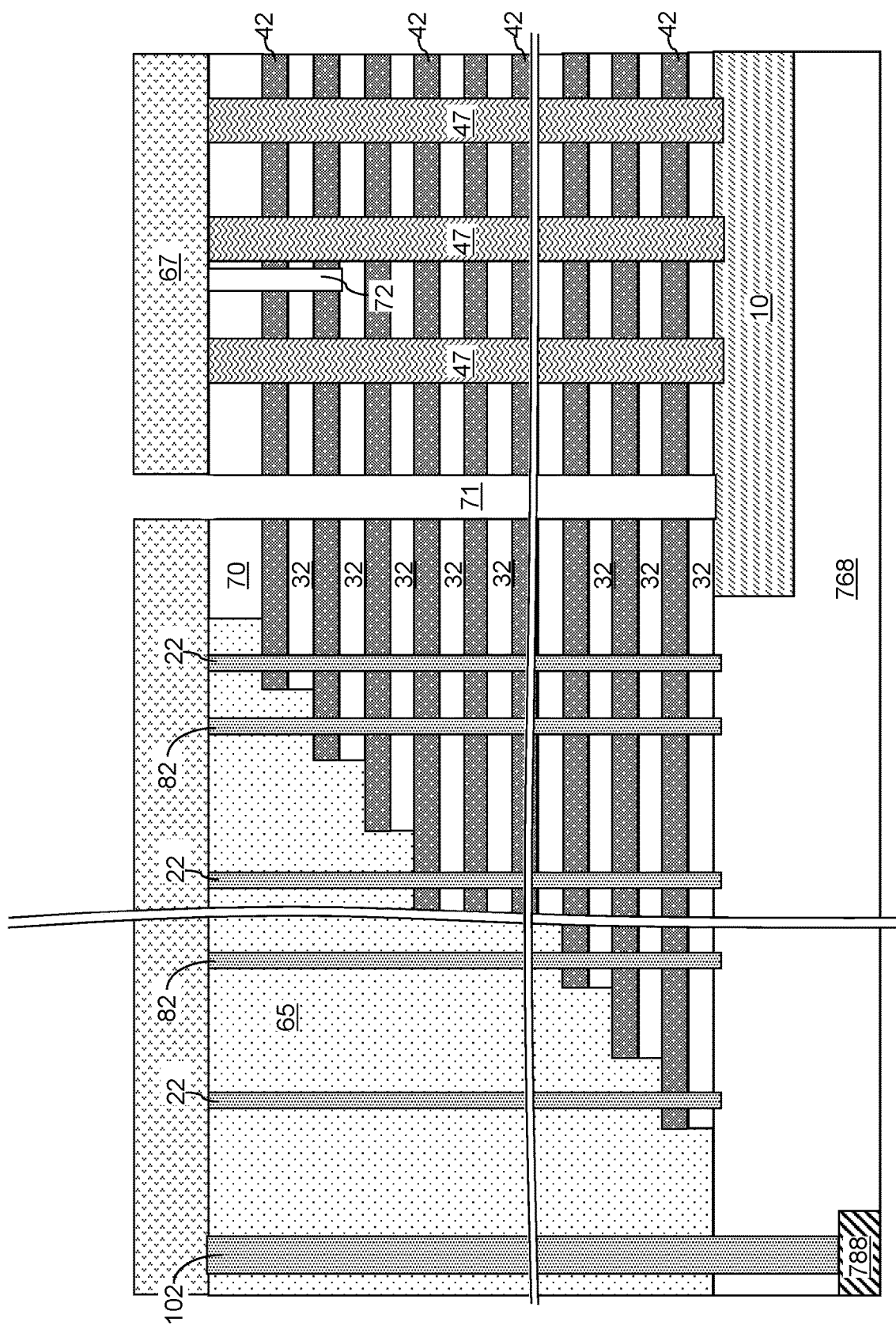
FIG. 6 is a vertical cross-sectional view of the exemplary structure after removal of the sacrificial backside opening fill structures according to an embodiment of the present disclosure.

Referring to FIG. 6, a photoresist layer 67 can be applied over the insulating cap layer 70, and can be lithographically patterned to form openings over areas of the sacrificial backside opening fill structures 73 while covering areas of the sacrificial memory opening fill structures 47, the sacrificial support opening fill structures 22, the sacrificial contact opening fill structures 82, the sacrificial backside opening fill structures 73, and the sacrificial through-memory-level via structures 102. In one embodiment, the openings in the photoresist layer 67 may be slit-shaped and overlie a respective row of the sacrificial backside opening fill structures 73. Alternatively, the openings in the photoresist layer 67 may include rows of discrete openings that overlie a respective one of the sacrificial backside opening fill structures 73.

A selective etch process can be performed to remove the sacrificial backside opening fill structures 73 selective to the materials of the insulating layers 32 and the sacrificial material layers 42. The selective etch process may employ an anisotropic etch process (such as a reactive ion etch process) or an isotropic etch process (such as a wet etch process). The sacrificial backside opening fill structures 73 are removed selective to the materials of the insulating layers 32 and the sacrificial material layers 42 to form voids in volumes of the backside openings 71. In one embodiment, the backside openings 71 can comprise cylindrical cavities having straight sidewalls.

Figure 7A:
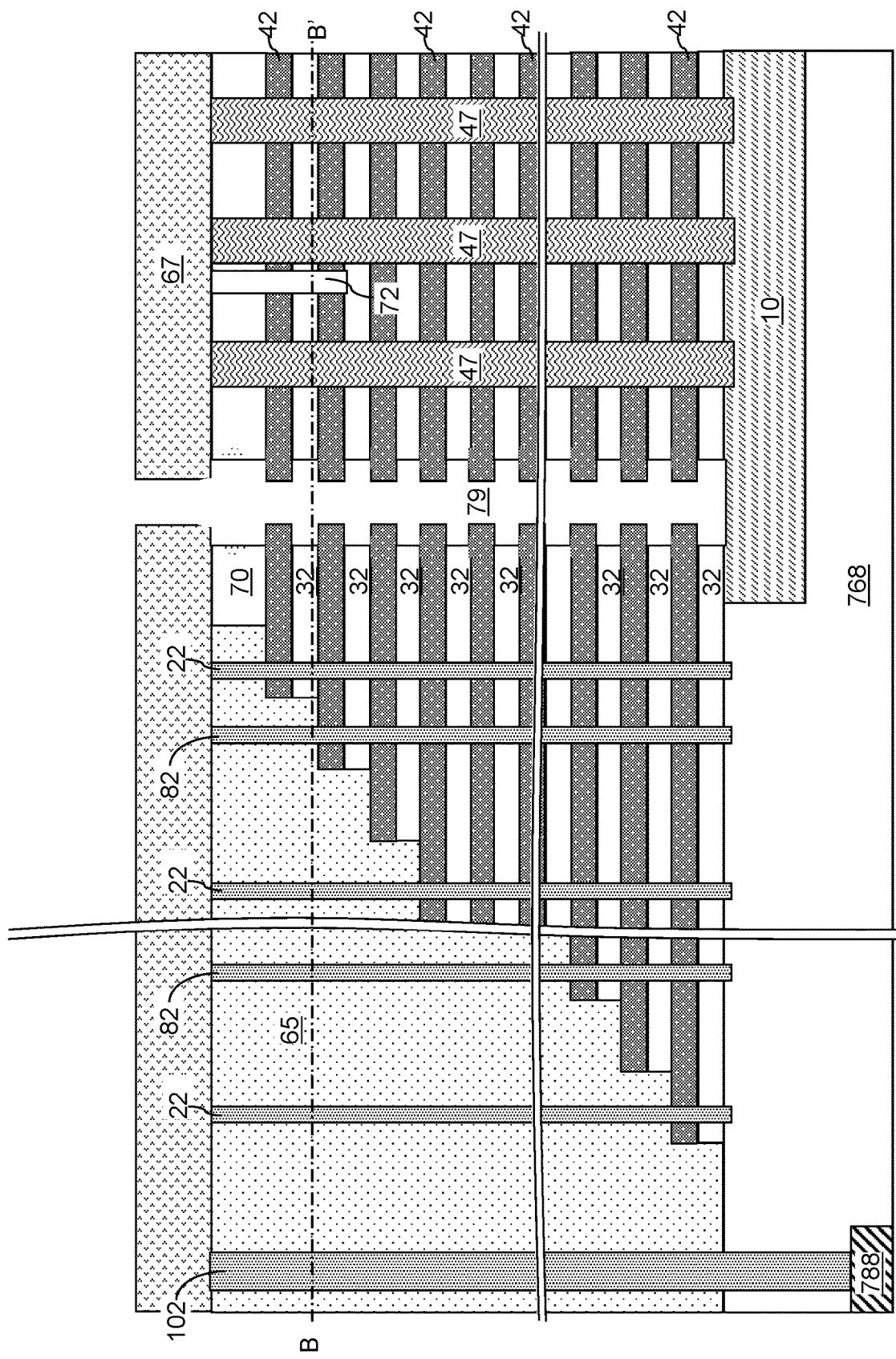
FIG. 7A is a vertical cross-sectional view of the exemplary structure after formation of continuous backside trenches according to an embodiment of the present disclosure.
Figure 7B:
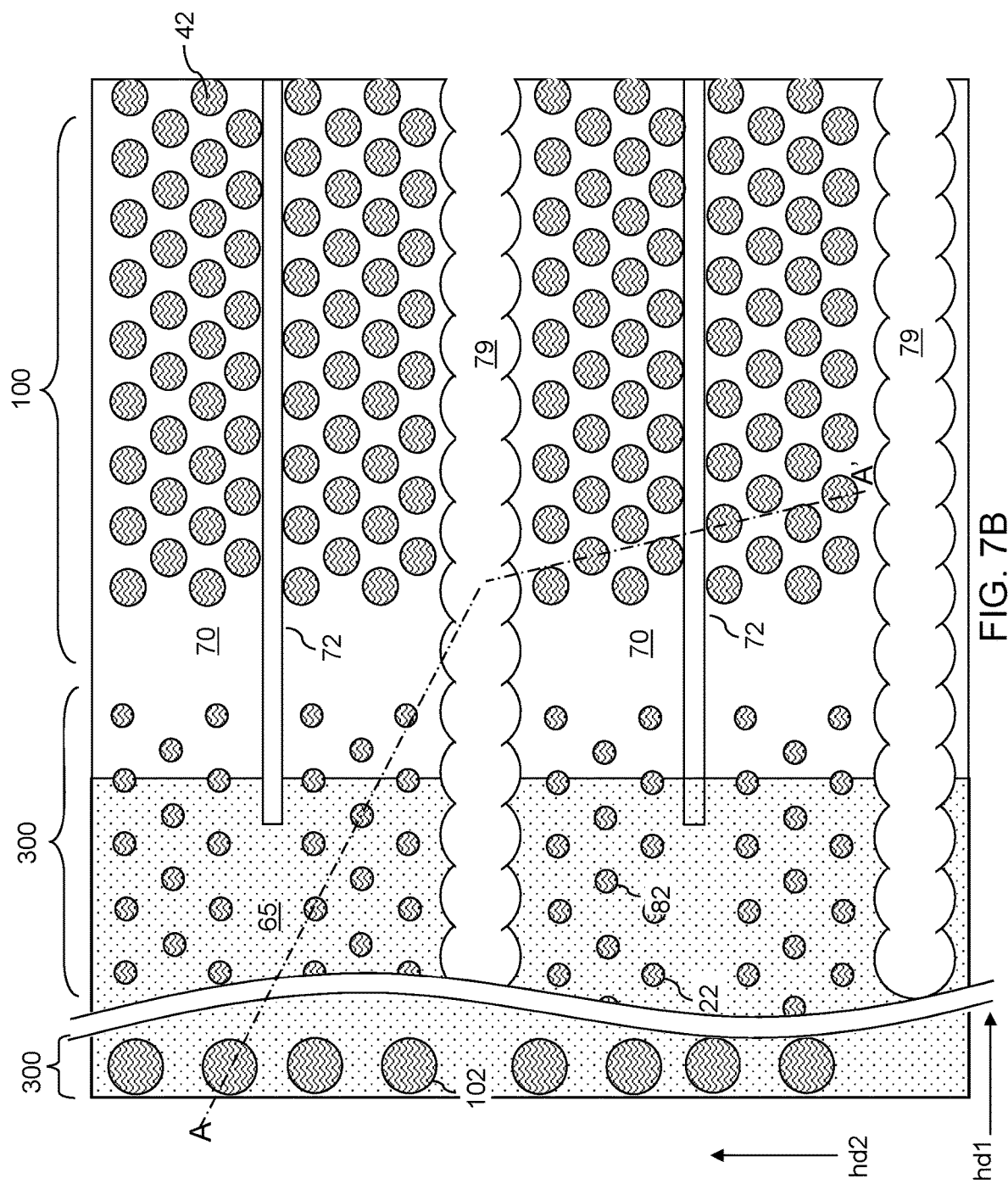
FIG. 7B is a horizontal cross-sectional view of the exemplary structure along the horizontal plane B-B' of FIG. 7A. The vertical plane A-A' is the plane of the cross-section for FIG. 7A.

Referring to FIGS. 7A and 7B, an isotropic etch process that isotropically etches the materials of the insulating layers 32 and the insulating cap layer 70 can be performed. The isotropic etch process may, or may not, be selective to the sacrificial material layers 42. For example, if the insulating layers 32 and the insulating cap layer 70 include undoped silicate glass or a doped silicate glass, and if the sacrificial material layers 42 include silicon nitride, the isotropic etch process may comprise a wet etch process employing dilute hydrofluoric acid.

The duration of the isotropic etch process can be selected such that the lateral recess distance at each level of the insulating layers 32 is greater than one half of a nearest neighbor spacing along the first horizontal direction hd1 within each row of backside openings 71. Each row of backside openings 71 can merge along the first horizontal direction hd1 to form a continuous backside trench 79. Each backside trench 79 can laterally extend continuously along the first horizontal direction hd1 through the entire volume of a respective row of backside openings 71 at each level of the insulating layers 32 and at the level of the insulating cap layer 70. A backside trench 79 may, or may not, laterally extend continuously along the first horizontal direction hd1 at levels of the sacrificial material layers 42 depending on the degree of collateral etching of the sacrificial material layers 42. The photoresist layer 67 can be subsequently removed, for example, by ashing. Generally, the backside trenches 79 can be formed by merging volumes of rows of the backside openings 71 employing an isotropic etch process that etches the material of the insulating layers 32.

Figure 8:
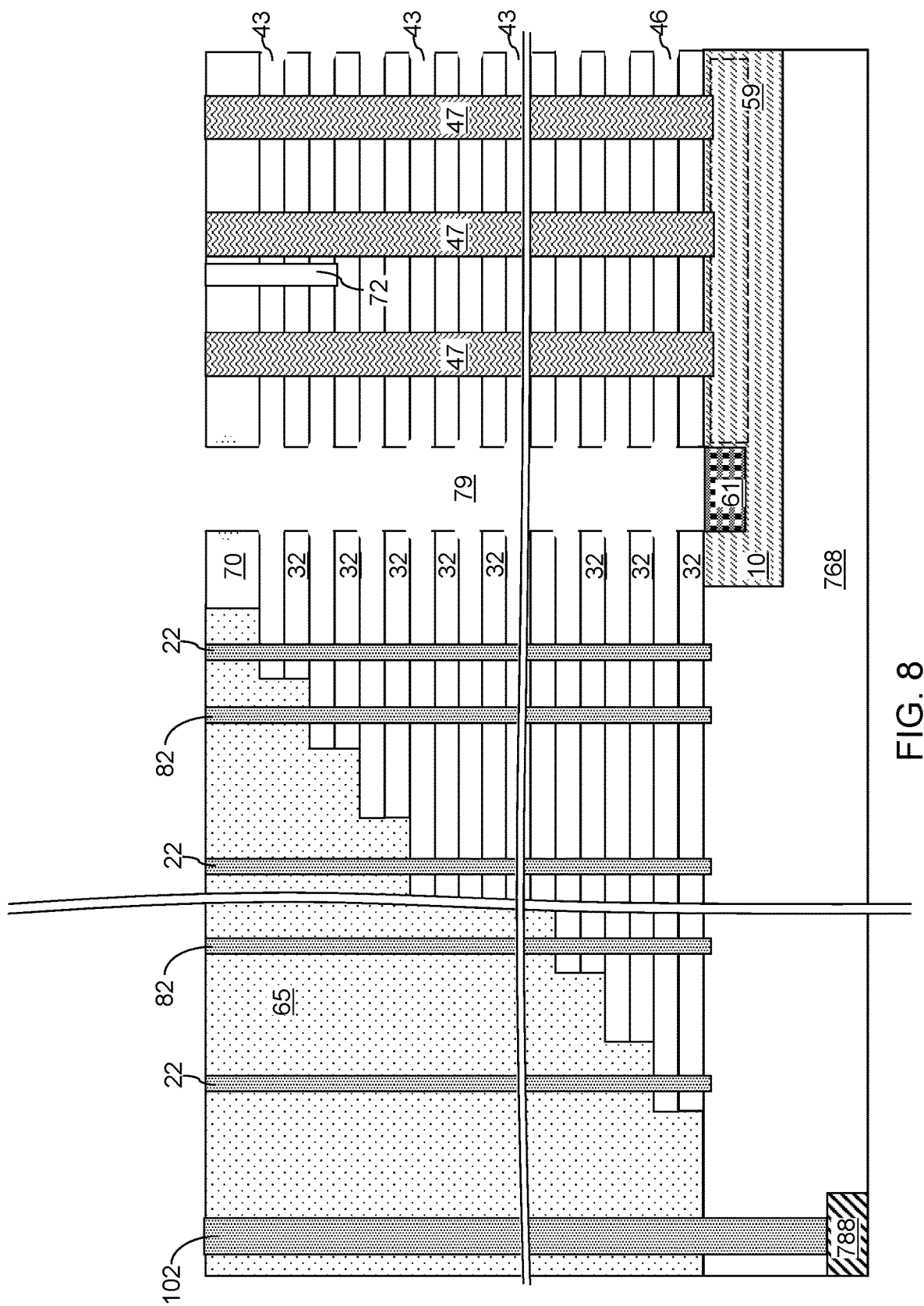
FIG. 8 is a vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79 employing an isotropic etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, and the sacrificial fill material of the various sacrificial fill structures (47, 22, 82, 102).

The etch process that removes the second material selective to the first material and the various sacrificial fill structures (47, 22, 82, 102) can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The various sacrificial fill structures (47, 22, 82, 102) and the retro-stepped dielectric material portion 65 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. In one embodiment, each backside recess 43 can define a space for receiving a respective word line.

Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

A source region 61 can be formed at a surface portion of the semiconductor material layer 10 under each backside trench 79 by implantation of electrical dopants into physically exposed surface portions of the semiconductor material layer 10. Each source region 61 is formed in a surface portion of the semiconductor material layer 10 that underlies a respective backside trench 79. Alternatively, the source region 61 may be omitted if a horizontal source contact line (e.g., a direct strap contact) is formed in contact with a sidewall of a vertical semiconductor channel to be formed in a later step.

An upper portion of the semiconductor material layer 10 that extends between the source region 61 and the sacrificial memory opening fill structures 47 is subsequently employed as a horizontal semiconductor channel 59 for a plurality of field effect transistors. The horizontal semiconductor channel 59 contacts the source region 61 and bottom portions of the sacrificial memory opening fill structures 47.

Figure 9:
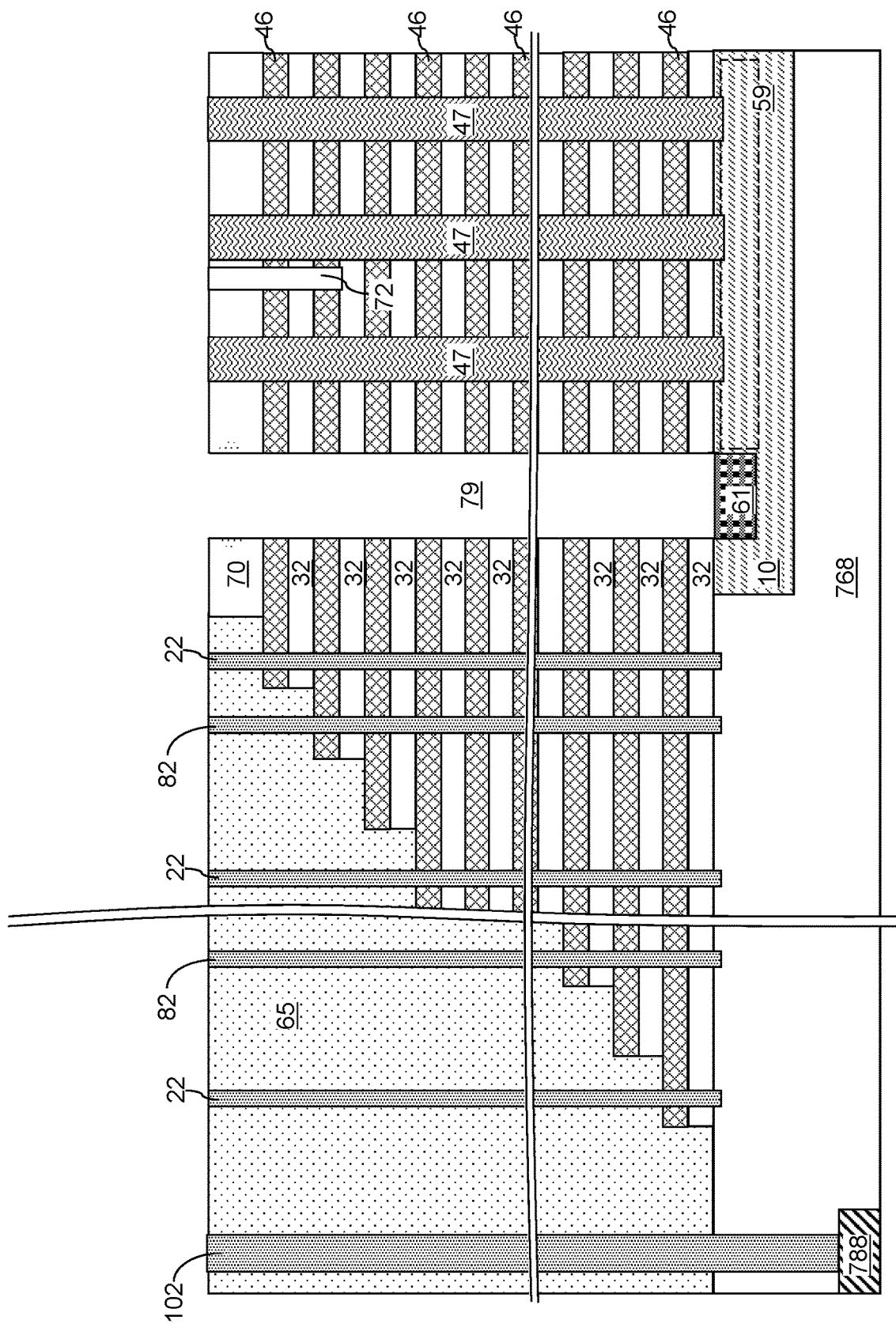
FIG. 9 is a vertical cross-sectional view of the exemplary structure after formation of electrically conductive layers according to an embodiment of the present disclosure.

Referring to FIG. 9, a backside blocking dielectric layer (not shown) can be optionally formed. The backside blocking dielectric layer, if present, comprises a dielectric material that functions as a control gate dielectric for the control gates to be subsequently formed in the backside recesses 43. The blocking dielectric layer may include a dielectric metal oxide such as aluminum oxide.

A metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the at least one the backside trench 79, and over the top surface of the insulating cap layer 70 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, molybdenum, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and various sacrificial fill structures (47, 22, 82, 102) by the metallic barrier layer, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the insulating cap layer 70. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the insulating cap layer 70.

The deposited metallic material of the continuous electrically conductive material layer is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Topmost and bottommost electrically conductive layers 46 may comprise drain side and source side select gate electrode for the memory strings.

Figure 10:
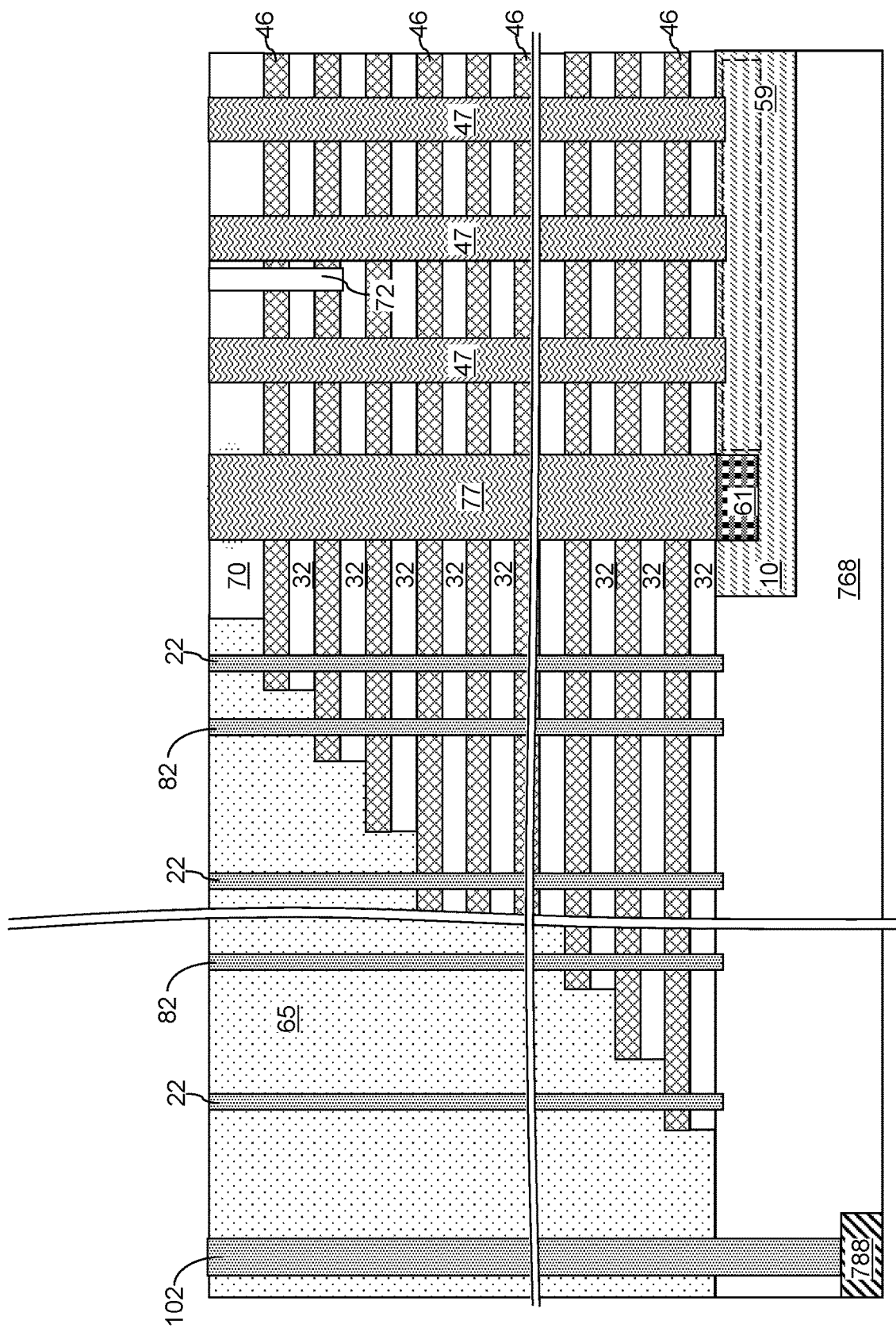
FIG. 10 is a vertical cross-sectional view of the exemplary structure after formation of sacrificial backside trench fill structures according to an embodiment of the present disclosure.

Referring to FIG. 10, a sacrificial trench fill material can be deposited in the backside trenches 79. Excess portions of the sacrificial trench fill material can be removed from above the top surface of the insulating cap layer 70 by a planarization process such as a chemical mechanical polishing process. Each remaining portion of the sacrificial trench fill material filling a backside trench 79 constitutes a sacrificial backside trench fill structure 77. The sacrificial trench fill material can include any material that may be employed as the sacrificial fill material at the processing steps of FIGS. 5A and 5B. The sacrificial trench fill material may be the same as, or may be different from, the sacrificial fill material of the various sacrificial fill structures (47, 22, 82, 102).

Figure 11:
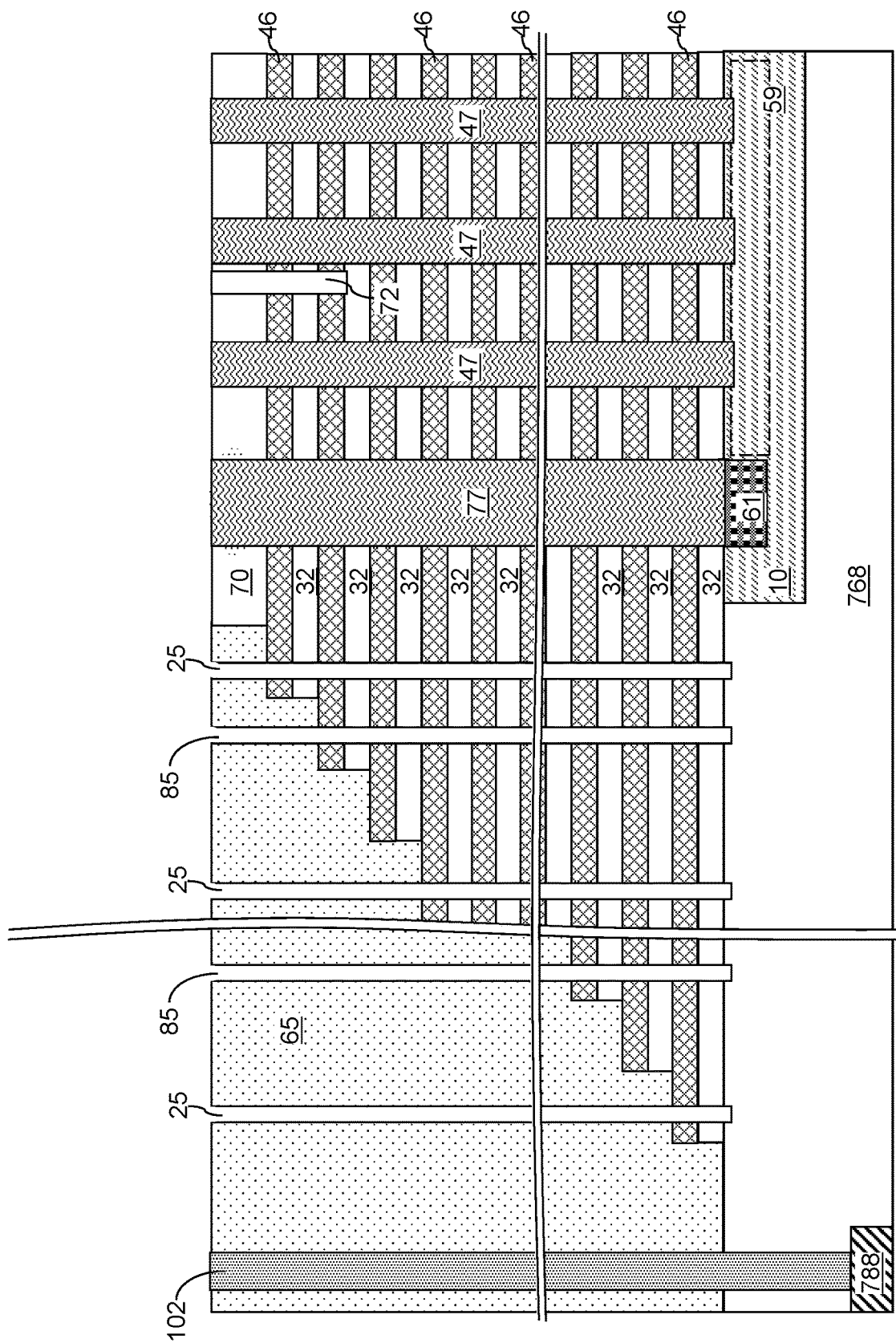
FIG. 11 is a vertical cross-sectional view of the exemplary structure after formation of contact cavities and support cavities according to an embodiment of the present disclosure.

Referring to FIG. 11, a photoresist layer (not shown) can be applied over the exemplary structure, and can be patterned to form opening over each area of the sacrificial support opening fill structures 22 and the sacrificial contact opening fill structures 82 while covering the sacrificial memory opening fill structures 47, the sacrificial through-memory-level via structures 102, and the sacrificial backside trench fill structures 77. A selective etch process can be performed to remove the sacrificial support opening fill structures 22 and the sacrificial contact opening fill structure 82 selective to the materials of the insulating layers 32 and the electrically conductive layers 46. The selective etch process may employ an anisotropic etch process (such as a reactive ion etch process) or an isotropic etch process (such as a wet etch process). The sacrificial support opening fill structures 22 and the sacrificial contact opening fill structure 82 are removed selective to the materials of the insulating layers 32 and the sacrificial material layers 42 to form voids in volumes of the sacrificial support opening fill structures 22 and the sacrificial contact opening fill structure 82. Each void from which a sacrificial support opening fill structure 22 is removed constitutes a support cavity 25, and each void from which a sacrificial contact opening fill structure 82 is removed constitutes a contact cavity 85.

In one embodiment, each of the support cavities 25 and the contact cavities 85 can vertically extend into the underlying material layer (such as the at least one second dielectric layer 768). In one embodiment, each of the support cavities 25 and the contact cavities 85 vertically extends through a respective subset of the electrically conductive layers 46 that includes at least the bottommost electrically conductive layer 46 of the electrically conductive layers 46. In one embodiment, a subset of the contact cavities 85 vertically extends through a respective plurality of electrically conductive layers 46 of the electrically conductive layers 46. The lower electrically conductive layers which are longer than upper electrically conductive layers. Therefore, more support cavities 25 and contact cavities 85 extend through the lower than the upper electrically conductive layers 46. Each electrically conductive layer 46 comprises at least one cylindrical sidewall that is physically exposed to a respective one of the contact cavities 85 upon formation of the contact cavities 85. In one embodiment, each electrically conductive layer 46 other than a topmost electrically conductive layer 46 comprises a respective plurality of cylindrical sidewalls that are physically exposed to a respective one of the contact cavities 85 upon formation of the contact cavities 85.

Figure 12:
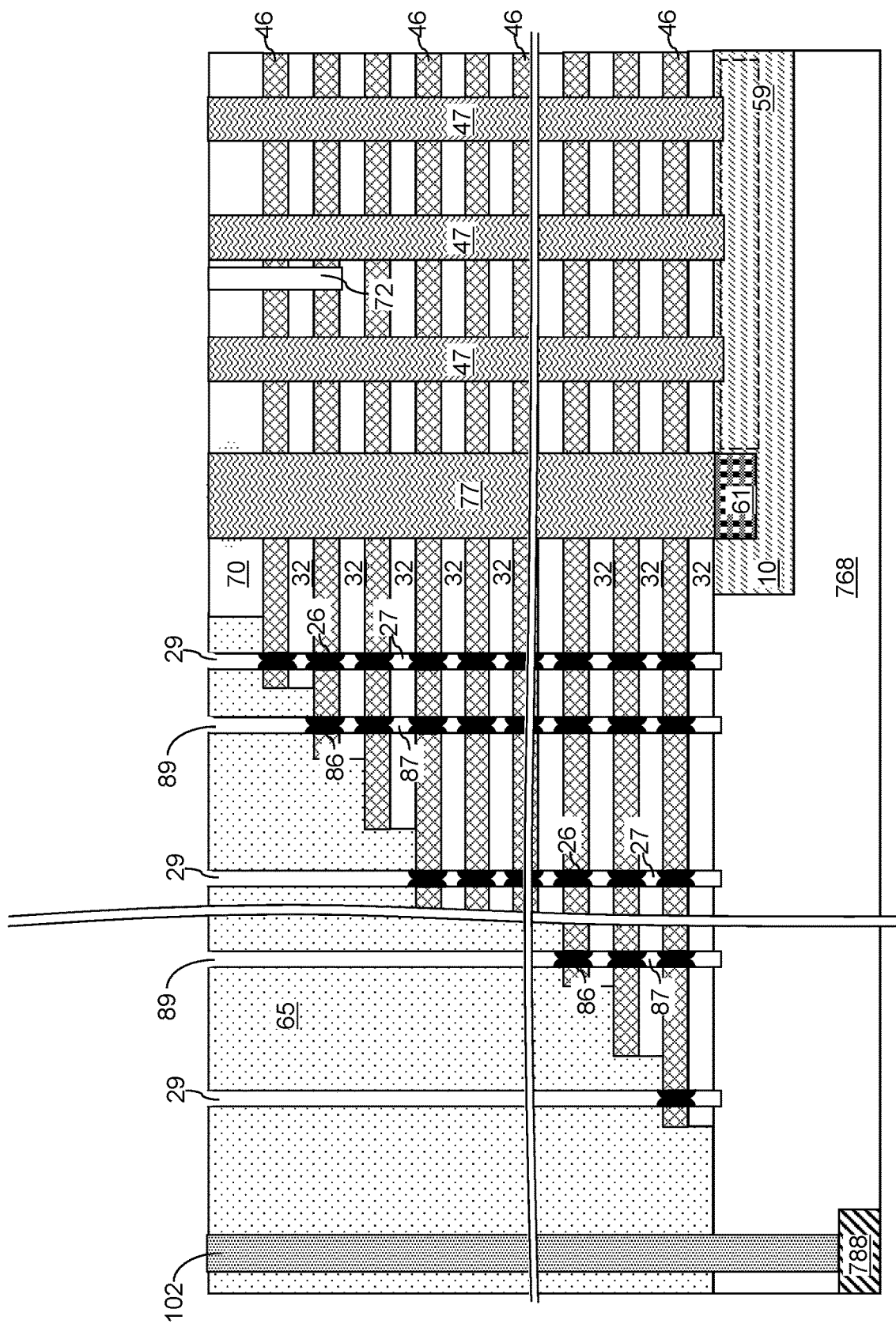
FIG. 12 is a vertical cross-sectional view of the exemplary structure after formation of conductive plugs according to an embodiment of the present disclosure.

Referring to FIG. 12, conductive plugs (26, 86) are formed directly on physically exposed cylindrical sidewalls of the electrically conductive layers 46 within each of the support cavities 25 and the contact cavities 85. According to an aspect of the present disclosure, the conductive plugs (26, 86) are formed by performing an area selective deposition (ASD) process that grows a conductive material laterally only from the physically exposed cylindrical surfaces of the electrically conductive layers 46 while suppressing growth of the conductive material from dielectric surfaces such as the surfaces of the insulating layers 32 and the insulating cap layer 70. In one embodiment, a metallic material deposition process that allows growth of a metallic material from metallic surfaces and suppress growth of the metallic material from dielectric surfaces can be employed. For example, the metallic material deposition process may include a selective CVD or ALD tungsten deposition process employing tungsten hexafluoride as a metallic precursor gas. Alternatively, the metallic material may comprise molybdenum, ruthenium or titanium nitride. The duration of the selective deposition process is selected such that the thickness of an isotropically deposited conductive material is sufficient to block any opening within a topmost discrete conductive material portion that is formed in each of the support cavities 25 and the contact cavities 85.

In one embodiment, the thickness of an isotropically deposited conductive material can be greater than the radius (or a semi-minor axis) of the support cavities 25 and the contact cavities 85. Thus, the topmost conductive plug (26, 86) of the at least one conductive plug (26, 86) that is formed within each of the support cavities 25 and the contact cavities 85 may not have any opening therethrough. In one embodiment, the isotropic deposition of the conductive material during formation of the conductive plugs (26, 86) can provide convex surfaces as the top surfaces and the bottom surfaces of the conductive plugs (26, 86).

Each of the conductive plugs (26, 86) laterally contacts a cylindrical sidewall of a respective one of the electrically conductive layers 46. The conductive plugs (26, 86) include support-opening conductive plugs 26 that are formed in a respective one of the support cavities 25, and contact-opening conductive plugs 86 that are formed in a respective one of the contact cavities 85. At least one support-opening conductive plug 26 is formed within each support cavity 25, and at least one contact-opening conductive plug 86 is formed within each contact cavity 85. A plurality of support-opening conductive plugs 26 can be formed within each support cavity 25 in a subset of the support cavities 25. A plurality of contact-opening conductive plugs 86 can be formed within each contact cavity 85 in a subset of the contact cavities 85.

At least one encapsulated cavity (i.e., air gap) (27, 87) is formed within each of the support cavities 25 and the contact cavities 85. The encapsulated cavities (27, 87) include support-opening encapsulated cavities 27 that are formed in the support cavities 25, and contact-opening encapsulated cavities 87 that are formed in the contact cavities 85. At least one support-opening encapsulated cavity 27 is formed within each of the support cavities 25, and at least one contact-opening encapsulated cavity 87 is formed within each of the contact cavities 85. In one embodiment, a plurality of support-opening conductive plugs 26 can be interlaced with a plurality of support-opening encapsulated cavities 27 in a support cavity 25. Thus, an air gap 27 may be located between vertically separated plugs 26 in each of the support cavities 25. In one embodiment, a plurality of contact-opening conductive plugs 86 can be interlaced with a plurality of contact-opening encapsulated cavities 87 in a contact cavity 85. Thus, an air gap 87 may be located between vertically separated plugs 86 in each of the contact cavities 85. A support via cavity 29 can be present above a topmost one of the at least one support-opening conductive plug 26 within each support cavity 25. A contact via cavity 89 can be present above a topmost one of the at least one contact-opening conductive plug within each contact cavity 85.

Figure 13:
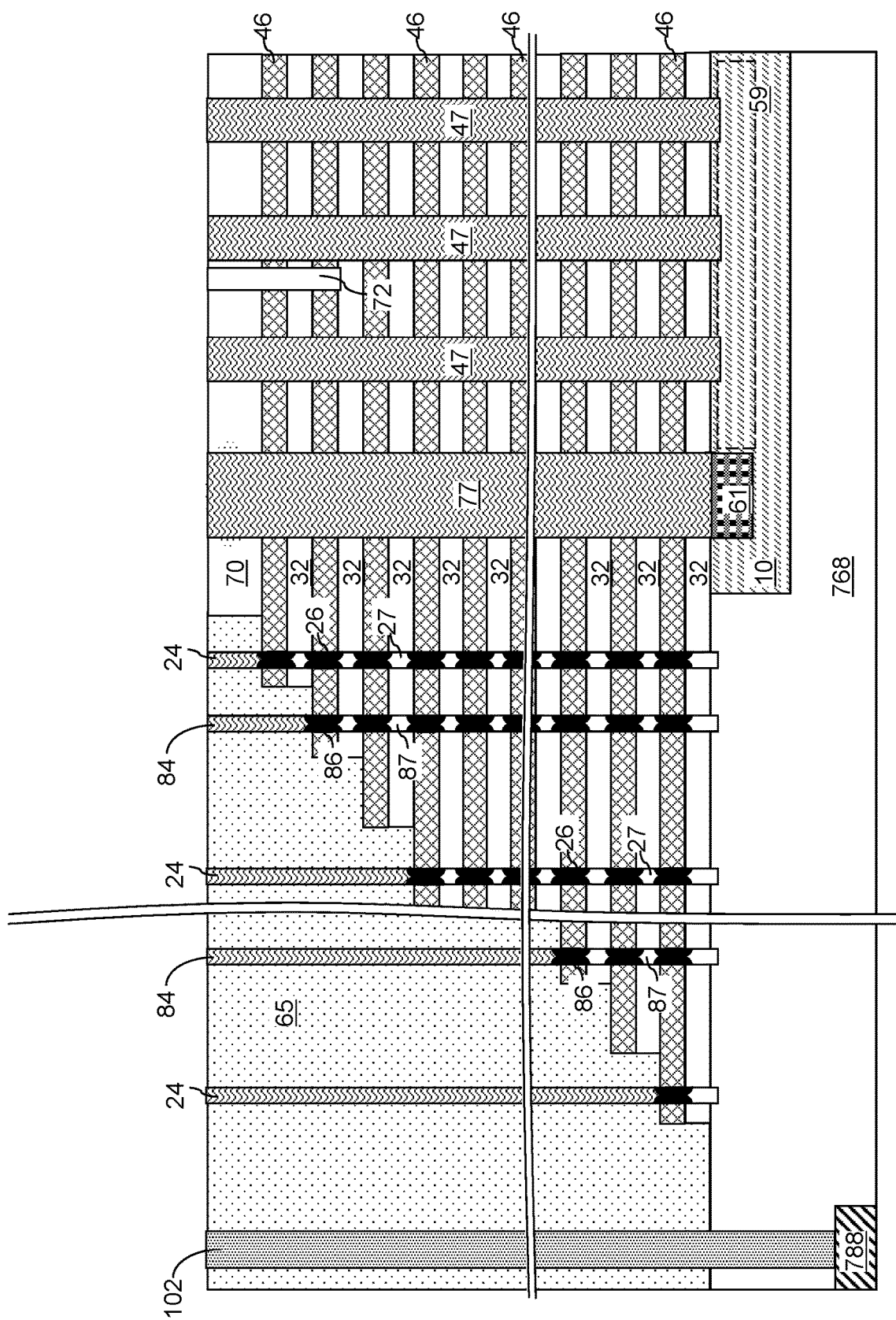
FIG. 13 is a vertical cross-sectional view of the exemplary structure after formation of insulating via structures according to an embodiment of the present disclosure.

Referring to FIG. 13, a sacrificial via fill material can be deposited in the support via cavities 29 and in the contact via cavities 89. The sacrificial via fill material may be any. The sacrificial via fill material may include any material that may be employed as the sacrificial fill material at the processing steps of FIGS. 5A and 5B or as the sacrificial trench fill material at the processing steps of FIG. 10. The sacrificial via fill material may be the same as, or may be different from, the sacrificial fill material of the various sacrificial fill structures (47, 22, 82, 102), and may be the same as, or may be different from, the sacrificial trench fill material of the sacrificial backside trench fill structures 77.

Excess portions of the sacrificial via fill material can be removed from above the horizontal plane including the top surfaces of the insulating cap layer 70 and the retro-stepped dielectric material portion 65. Remaining portions of the sacrificial via fill material include sacrificial via fill structures (24, 84). The sacrificial via fill structures (24, 84) include support-opening sacrificial via fill structures 24 that are formed in the support via cavities 29, and contact-opening sacrificial via fill structures 84 that are formed in the contact via cavities 89.

Figure 14:
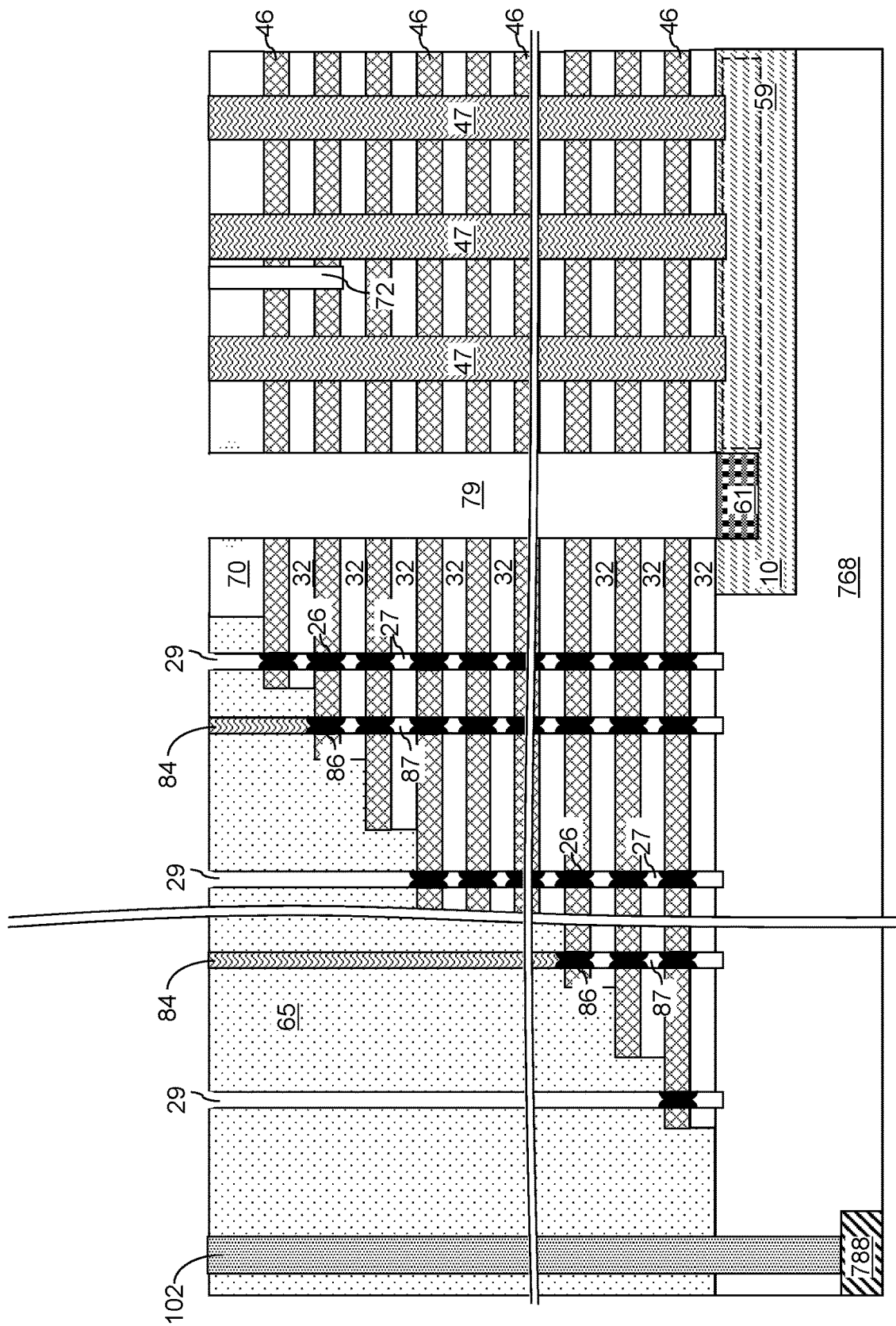
FIG. 14 is a vertical cross-sectional view of the exemplary structure after formation of a void within each backside trench by removal of the sacrificial backside trench fill structures according to an embodiment of the present disclosure.

Referring to FIG. 14, a photoresist layer (not shown) can be applied over the insulating cap layer 70 and the retro-stepped dielectric material portion 65, and can be lithographically patterned to form openings in areas that overlie the sacrificial backside trench fill structures 77 and the support-opening sacrificial via fill structures 24, while covering the sacrificial memory opening fill structures 47, the contact-opening sacrificial via structures 84, and the through-memory-level sacrificial via structures 102. A selective etch process can be performed to etch the materials of the sacrificial backside trench fill structures 77 and the support-opening sacrificial via fill structures 24 selective to the materials of the insulating layers 32 and the electrically conductive layers 46. Voids are formed in volumes from the sacrificial backside trench fill structures 77 and the support-opening sacrificial via fill structures 24 are removed. Thus, voids are formed in the volumes of the backside trenches 79 and the support via cavities 29. The photoresist layer can be subsequently removed, for example, by ashing.

Figure 15:
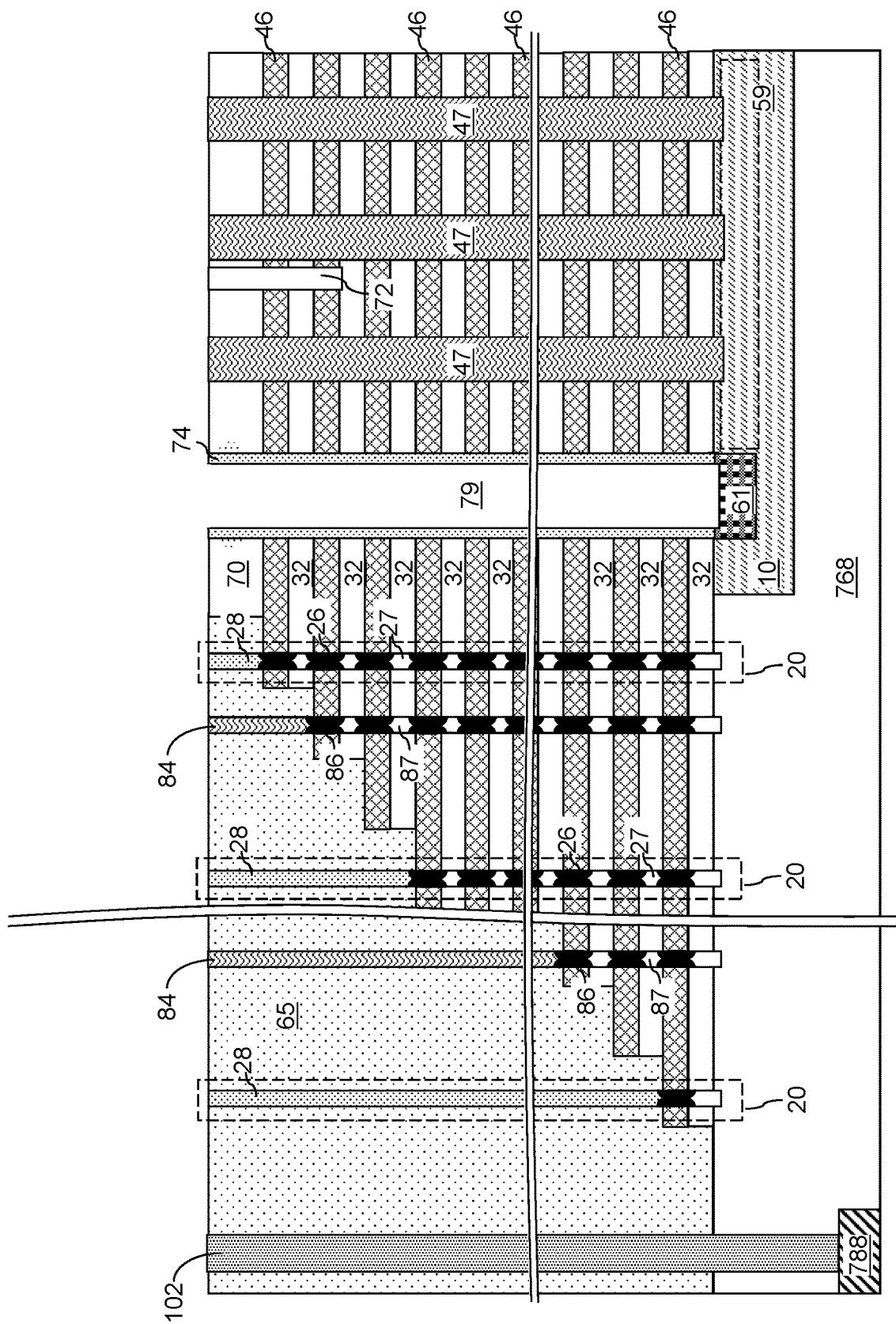
FIG. 15 is a vertical cross-sectional view of the exemplary structure after formation of an insulating spacer in each backside trench according to an embodiment of the present disclosure.

Referring to FIG. 15, a dielectric material, such as silicon oxide can be conformally deposited in the volumes of the backside trenches 79 and the support via cavities 29. For example, a chemical vapor deposition can be employed to deposit the dielectric material. The thickness of the deposited dielectric material can be greater than the radius of the support via cavities 29, and is less than one half of the maximum width of the backside trenches 79 along the second horizontal direction hd2. In one embodiment, the thickness of the deposited dielectric material can be less than one half of the minimum width of the backside trenches 79 along the second horizontal direction hd2.

An anisotropic etch process can be performed to remove horizontal portions of the deposited dielectric material from above the insulating cap layer 70 and from above the top surfaces of the source regions 61. Each remaining portion of the dielectric material that fills a respective one of the support via cavities 29 comprises a dielectric via structure 28. Each remaining vertically-extending portion of the dielectric material located on sidewalls of the backside trenches 79 comprises an insulating spacer 74. The set of all material portions that fills the entire volume of a respective one of the support openings 21 as formed at the processing steps of FIGS. 4A and 4B constitutes a pillar-shaped support-opening assembly 20.

Figure 16:
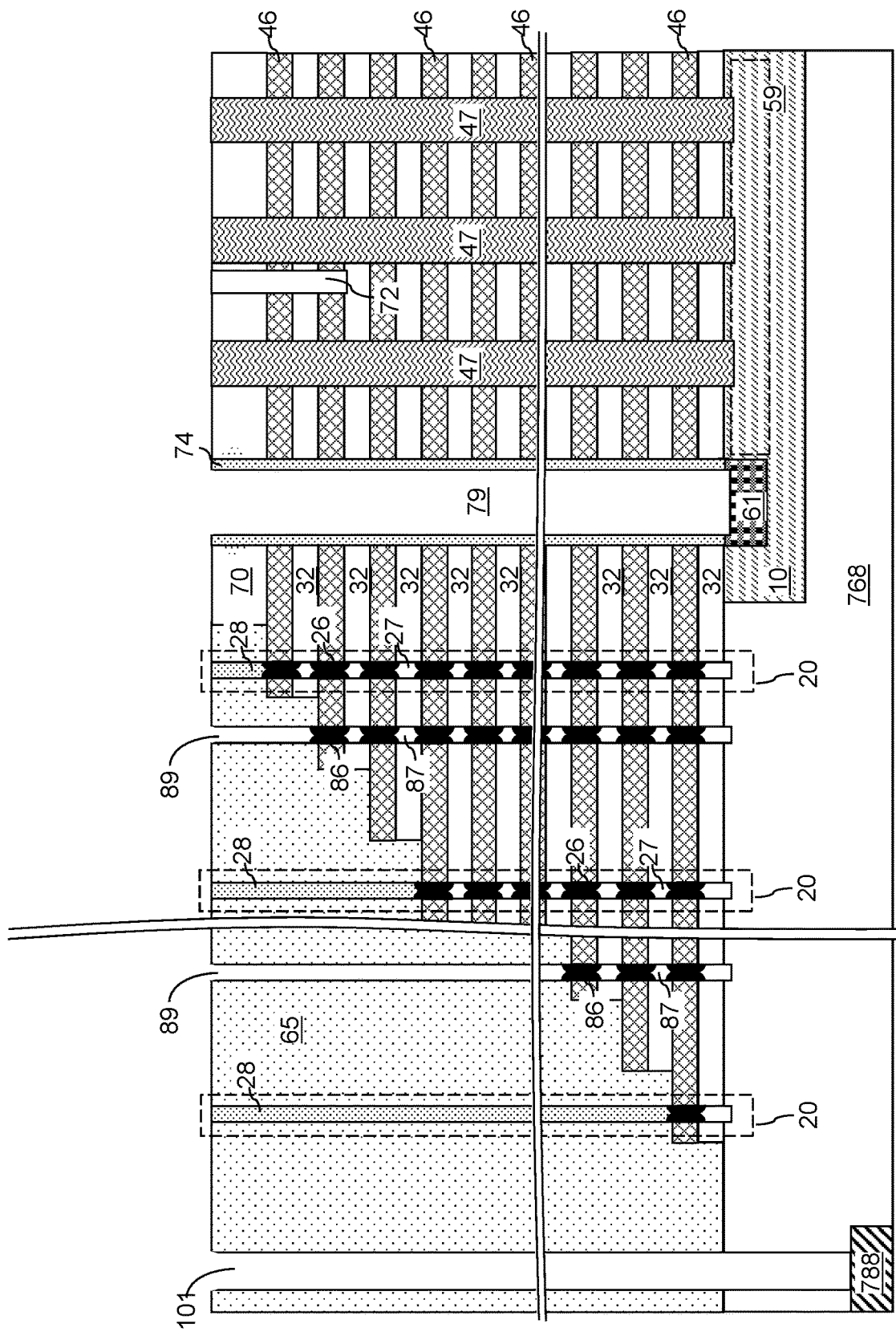
FIG. 16 is a vertical cross-sectional view of the exemplary structure after removal of the sacrificial through-memory-level via structures and contact-opening dielectric via structures according to an embodiment of the present disclosure.

Referring to FIG. 16, a photoresist layer (not shown) can be applied over the insulating cap layer 70 and the retro-stepped dielectric material portion 65, and can be lithographically patterned to form openings in areas that overlie the contact-opening sacrificial via fill structures 84 and the through-memory-level sacrificial via structures 102, while covering the sacrificial memory opening fill structures 47. The photoresist layer may cover the backside trenches 79 and the dielectric via structures 28. A selective etch process can be performed to etch the materials of the contact-opening sacrificial via fill structures 84 and the through-memory-level sacrificial via structures 102 selective to the materials of the insulating layers 32, the electrically conductive layers 46, the retro-stepped dielectric material portion 65, and the landing-pad-level metal line structures 788. Voids are formed in volumes from the contact-opening sacrificial via fill structures 84 and the through-memory-level sacrificial via structures 102 are removed. Thus, voids are formed in the volumes of the through-memory-level via openings 101 and the contact via cavities 89. The photoresist layer can be subsequently removed, for example, by ashing.

Figure 17:
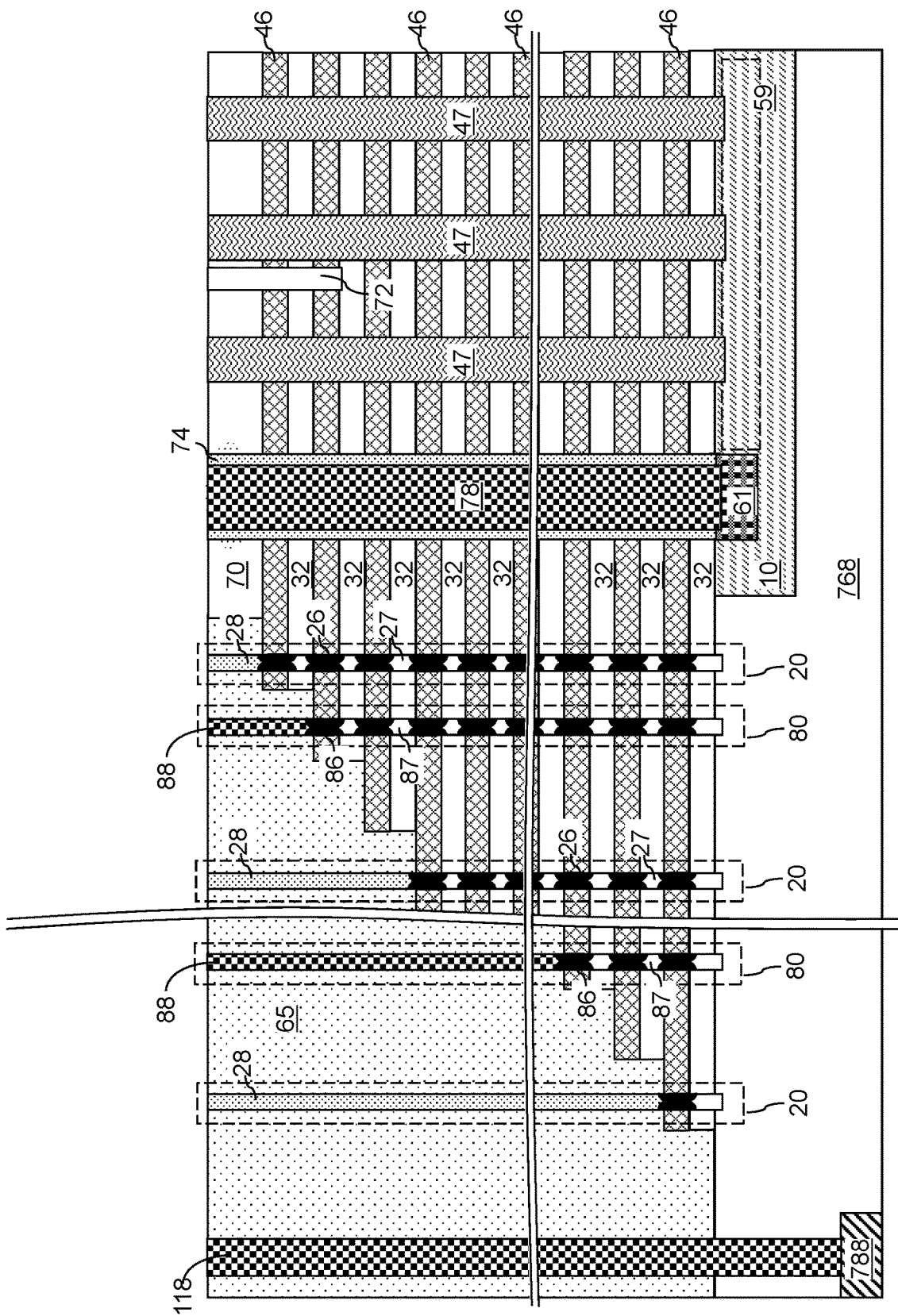
FIG. 17 is a vertical cross-sectional view of the exemplary structure after formation of backside contact via structures, through-memory-level connection via structures, and contact via structures according to an embodiment of the present disclosure.

Referring to FIG. 17, at least one conductive material (such as at least one metallic material) can be deposited in the backside trenches 79, the contact via cavities 89, and the through-memory-level via openings 101 by a conformal deposition process. The conductive material may comprise a metal nitride barrier, such as TiN, and a metal fill, such as tungsten, molybdenum, ruthenium, aluminum or copper. Excess portions of the at least one conductive material can be removed from above the horizontal plane including the top surfaces of the insulating cap layer 70 and the retro-stepped dielectric material portion 65. Each remaining portion of the at least one conductive material that fills a respective one of the backside trenches 79 constitutes a backside contact via structure 78. Each remaining portion of the at least one conductive material that fills a respective one of the through-memory-level via openings 101 constitutes a through-memory-level connection via structure 118. Each remaining portion of the at least one conductive material that fills a respective one of the contact via cavities 89 constitutes a contact via structure 88, which includes word line contact via structures that are electrically connected to a subset of the electrically conductive layers 46 that function as word lines, and select gate contact vis structures that are electrically connected to a subset of the electrically conductive layers 46 that function as select gate electrodes. Each conductive via structure 88 can be formed on a convex surface of a respective one of the contact-opening conductive plugs 86.

The pillar-shaped support-opening assembly 20 comprises an assembly of structural components that fills a respective support opening 21 and having an overall pillar shape having a straight sidewall vertically extending from a bottommost surface thereof to a topmost surface thereof. The set of all material portions that fills the entire volume of a respective one of the contact openings 81 as formed at the processing steps of FIGS. 4A and 4B constitutes a pillar-shaped contact-opening assembly 80, i.e., an assembly of structural components that fills a respective contact opening 81 and having an overall pillar shape having a straight sidewall vertically extending from a bottommost surface thereof to a topmost surface thereof.

According to an aspect of the present disclosure, pillar-shaped contact-opening assemblies 80 are formed in the contact openings 81 upon formation of the conductive via structures 88. Each of the pillar-shaped contact-opening assembly 80 comprises a volume of a respective one of the contact cavities 85, i.e., has the same volume as the respective one of the contact cavities 85 at the processing steps of FIG. 11 which is the same as the volume of a respective contact opening 81 at the processing steps of FIGS. 4A and 4B. The volume of each pillar-shaped contact-opening assembly 80 can be a respective pillar shaped volume, which vertically extending through the retro-stepped dielectric material portion 65 and a region of the alternating stack (32, 46) that underlies the retro-stepped dielectric material portion 65. Each pillar-shaped contact-opening assembly 80 includes at least one contact-opening conductive plug 86 and at least one encapsulated cavity 87, i.e., an air gap comprising cavity that does not have any connection path to the ambient located outside the exemplary structure. Each of the pillar-shaped contact-opening assemblies 80 comprises a respective first conductive plug 86 (which is a topmost conductive plug) that laterally contacts a cylindrical sidewall of one of the electrically conductive layers 46 and a conductive via structure 88 that contacts a top surface of the respective first conductive plug 86 and vertically extends at least to a horizontal plane including a top surface of the retro-stepped dielectric material portion 65.

In one embodiment, each of the pillar-shaped contact-opening assemblies 80 comprises a first encapsulated cavity 87 that underlies the first conductive plug 86 and is free of any solid phase material. In one embodiment, a subset of the pillar-shaped contact-opening assemblies 80 comprises a respective second conductive plug 86 that underlies the first encapsulated cavity 87 and laterally contacting a cylindrical sidewall of another of the electrically conductive layers 46.

In one embodiment, within the subset of the pillar-shaped contact-opening assemblies 80, the second conductive plug 86 is vertically spaced from an underlying material layer (such as the at least one second dielectric layer 768) that underlies the alternating stack (32, 46) by a plurality of additional encapsulated cavities 87 that are free of any solid phase material and a plurality of additional contact plugs. Each pillar-shaped contact-opening assembly 80 that vertically extends through more than four electrically conductive layers 46 has such a configuration.

In one embodiment, a bottommost encapsulated cavity 87, in case a plurality of encapsulated cavities 87 are present within a pillar-shaped contact-opening assembly 80, is bounded by and is defined by a set of surfaces including a cylindrical surface of the underlying material layer (such as the at least one second dielectric layer 768), a recessed surface of the underlying material layer adjoined to a bottom edge of the cylindrical surface, a cylindrical surface of a bottommost one of the insulating layers 32, and a bottom surface of the bottommost conductive plug 86. All other encapsulated cavities 87 except for the bottommost encapsulated cavity 87 is bounded by, and is defined by, a set of surfaces including a cylindrical surface of a respective one of the insulating layers 32, a bottom surface of an overlying conductive plug 86, and a top surface of an underlying conductive plug 86.

In one embodiment, the first encapsulated cavity and the additional encapsulating cavities are not present between the memory stack structures 55 located in a memory array region 100; and the first conductive plug 86 comprises the topmost conductive plug in the first one of the pillar-shaped contact-opening assemblies 80, and the additional conductive plugs 86 do not electrically contact the conductive via structure 88 that contacts the top surface of the first conductive plug.

In one embodiment, the top surface of the first conductive plug 86 is convex, and a bottom surface of the first conductive plug 86 is convex. In one embodiment, a subset of the pillar-shaped contact-opening assemblies 80 comprises additional conductive plugs 86, and each electrically conductive layer 46 that underlies one of the electrically conductive layers 46 in contact with the first conductive plug 86 comprises a respective cylindrical sidewall that is contacted by a respective one of the additional conductive plugs 86 within a respective of the pillar-shaped contact-opening assemblies 80.

In one embodiment, each of the pillar-shaped contact-opening assemblies 80 comprises a respective straight cylindrical sidewall that is vertical or tapered, and vertically extends from the horizontal plane including the top surface of the retro-stepped dielectric material portion 65 to a respective recessed surface of an underlying material layer that underlies the alternating stack (32, 46).

In one embodiment, one or more of the pillar-shaped contact-opening assemblies 80 comprise a vertically alternating stack of encapsulated cavities 87 and additional conductive plugs 86, each of the encapsulated cavities 87 is located at a level of a respective one of the insulating layers 32, and each of the additional conductive plugs 86 is located at a level of a respective one of the electrically conductive layers 46.

In one embodiment, each of the pillar-shaped contact-opening assemblies 80 comprises at least one pair of a conductive plug 86 and an encapsulated cavity 87 arranged along a vertical direction, and a total number of such pairs is different among the pillar-shaped contact-opening assemblies 80. In one embodiment, a total number of the electrically conductive layers 46 is an integer N in a range from 4 to 1,024, and the total number of the such pair ranges from 1 to N.

In one embodiment, a second one of the pillar-shaped contact-opening assemblies 80 comprises an additional conductive plug 86 that laterally contacts a cylindrical sidewall of another of the electrically conductive layers 46 and an additional conductive via structure 88 that contacts a top surface of the additional conductive plug 86 and vertically extends at least to the horizontal plane including the top surface of the retro-stepped dielectric material portion 65. In one embodiment, each of the pillar-shaped contact-opening assemblies 80 vertically extends through a bottommost one of the electrically conductive layers 46, and comprises a respective conductive plug 86 that contacts a respective cylindrical sidewall of the bottommost one of the electrically conductive layers 46. In one embodiment, the first conductive plug 86 comprises a different conductive material than the electrically conductive layers 46 and the conductive via structure 88. For example, the first conductive plug 86 may comprise Mo, Ru or TiN, while the electrically conductive layers 46 and the conductive via structure 88 may comprise tungsten. Alternatively, all three may comprise the same material (e.g., tungsten).

Figure 18:
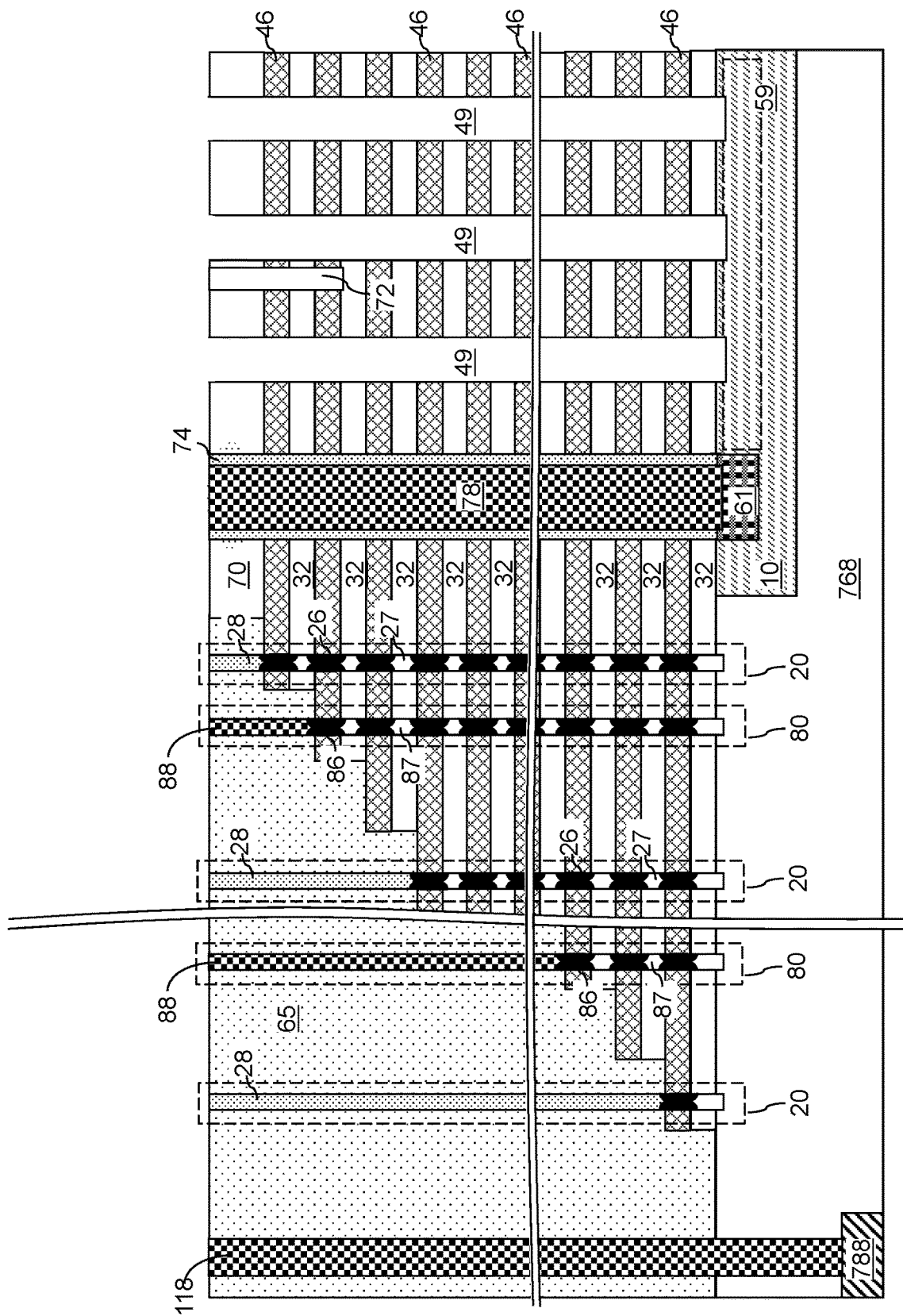
FIG. 18 is a vertical cross-sectional view of the exemplary structure after formation of voids in the memory openings according to an embodiment of the present disclosure.

Referring to FIG. 18, the sacrificial fill material of the sacrificial memory opening fill structures 47 can be removed by performing a selective etch process that etches the sacrificial fill material of the sacrificial memory opening fill structures selective to the materials of the insulating layers 32, the electrically conductive layers 46, the retro-stepped dielectric material portion 65, and the conductive material of the backside contact via structures 78, the contact via structures 88, and the through-memory-level connection via structure 118. Voids are formed within the volumes of the memory openings 49.

FIGS. 19A-19G are sequential schematic vertical cross-sectional views of a memory opening 49 within the exemplary structure during formation of a memory stack structure 55, an optional dielectric core 62, and a drain region 63 therein according to an embodiment of the present disclosure.

Figure 19A:
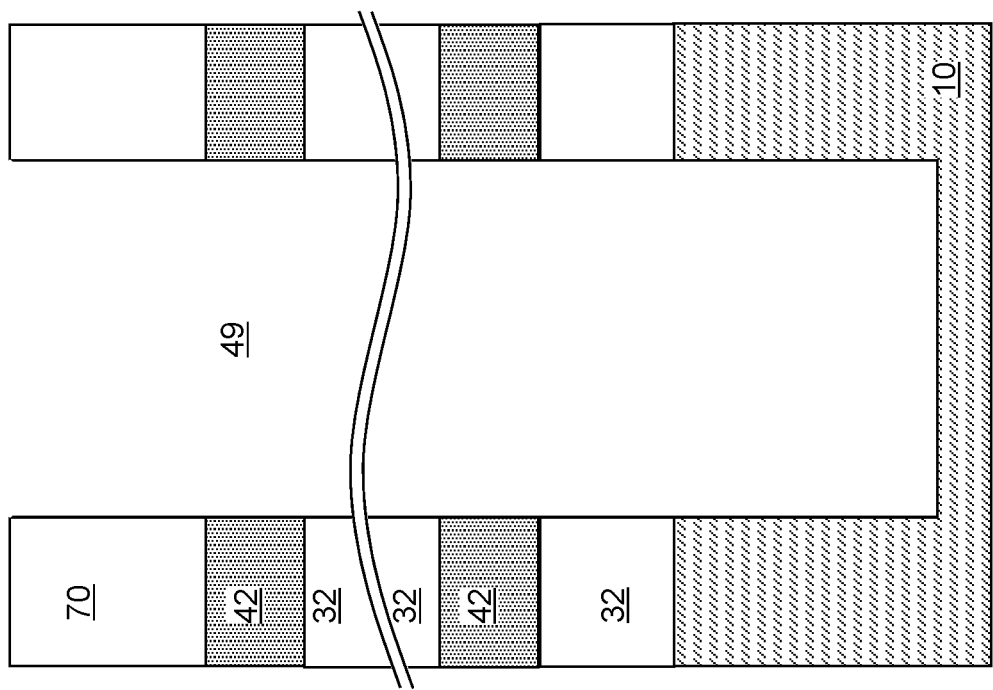

Referring to FIG. 19A, a memory opening 49 in the exemplary device structure of FIG. 18 is illustrated. The memory opening 49 extends through the insulating cap layer 70, the alternating stack (32, 46), and optionally into an upper portion of the semiconductor material layer 10. The recess depth of the bottom surface of each memory opening 49 with respect to the top surface of the semiconductor material layer 10 can be in a range from 0 nm to 30 nm, although greater recess depths can also be employed.

Referring to FIG. 19B, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 19C, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A set of a blocking dielectric layer 52, a memory material layer 54, and a tunneling dielectric layer 56 in a memory opening 49 constitutes a memory film 50. The memory film 50 may include a plurality of charge storage regions (comprising portions of the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 19D, a semiconductor channel layer 60L can be deposited directly on the semiconductor surface of the semiconductor material layer 10, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 19E, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 19F, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Figure 20A:
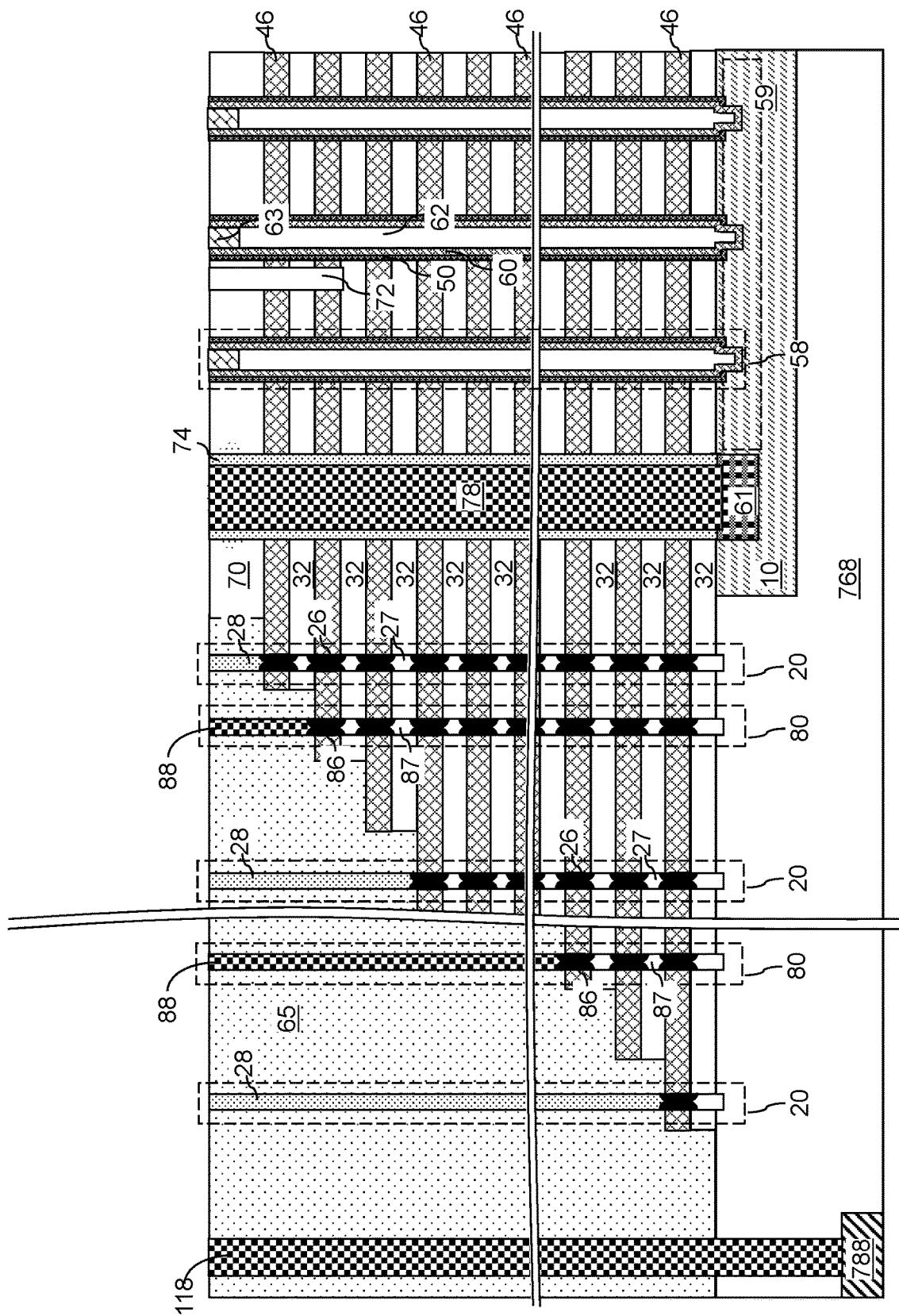
FIG. 20A is a schematic vertical cross-sectional view of the exemplary structure at the processing steps of FIG. 19G.
Figure 20B:
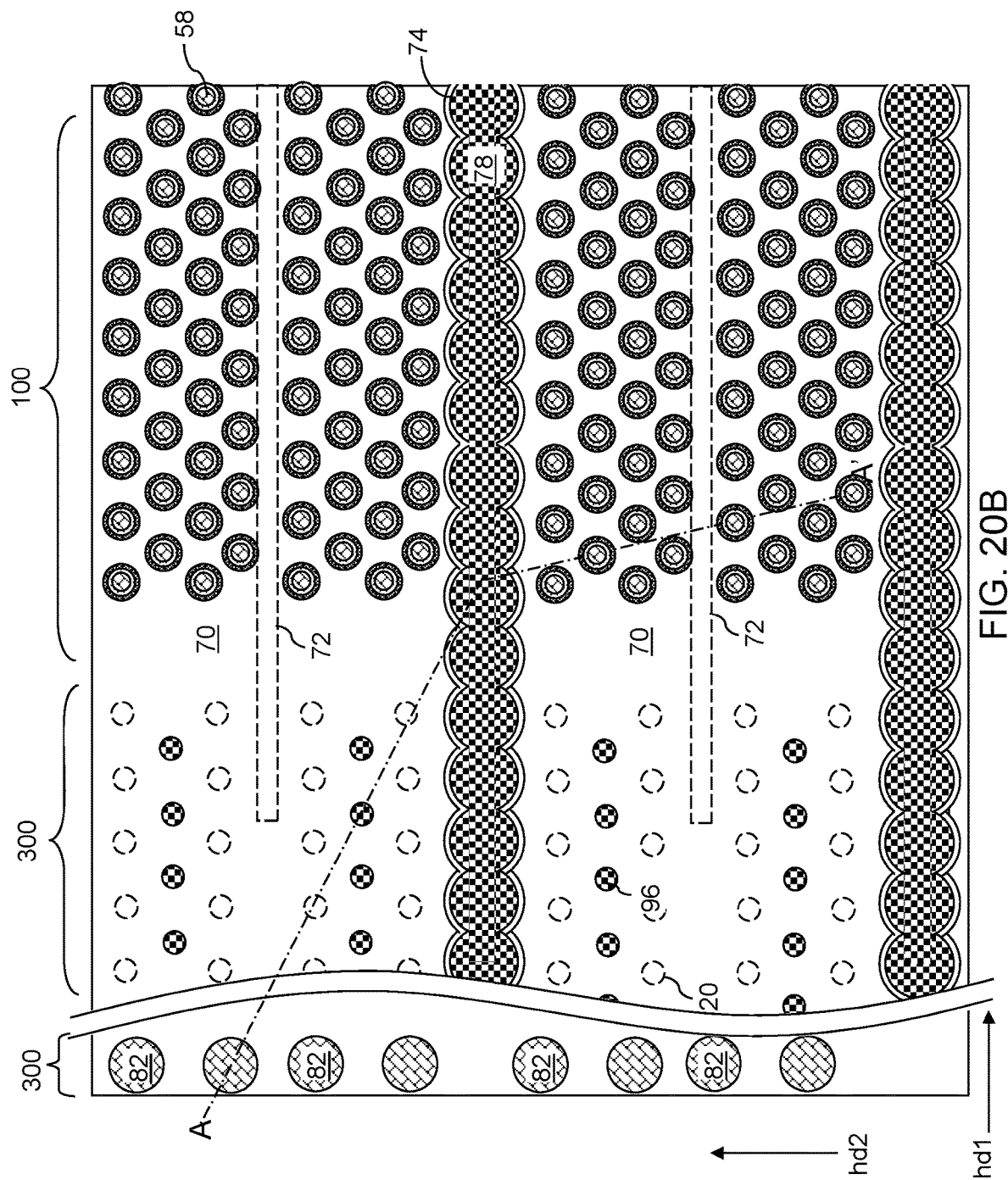
FIG. 20B is a top-down view of the exemplary structure of FIG. 20A. The vertical plane A-A' is the plane of the schematic vertical cross-sectional view of FIG. 20A.

Referring to FIGS. 19G, 20A, and 20B, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a memory stack structure 55, a dielectric core 62, and a drain region 63 within a memory opening 49 is herein referred to as a memory opening fill structure 58.

Subsequently, upper-level metal interconnect structures (not shown) embedded in upper-level dielectric material layers (not shown) can be formed over the insulating cap layer 70 and the retro-stepped dielectric material portion 65. The upper-level metal interconnect structures include drain contact via structures (not shown) contacting a respective one of the drain regions 63, bit lines (not shown) contacting a respective subset of the drain contact via structures, and other metal via structures and metal line structures that provide electrical connection to the contact via structures 88, the backside contact via structures 78, and the through-memory-level connection via structures 118.

Referring to all drawings and according to various embodiments of the present disclosure, a three-dimensional memory device comprises an alternating stack of insulating layers 32 and electrically conductive layers 46 having stepped surfaces and located over a substrate 8; memory stack structures 55 extending through the alternating stack (32, 46), wherein each of the memory stack structures 55 comprises a vertical semiconductor channel 60 and a vertical stack of memory elements (which may comprise as portions of the charge storage layer 54 located at levels of the electrically conductive layers 46); a retro-stepped dielectric material portion 65 overlying the stepped surfaces; and pillar-shaped contact-opening assemblies 80 located within a respective pillar-shaped volume vertically extending through the retro-stepped dielectric material portion 65 and a region of the alternating stack (32, 46) that underlies the retro-stepped dielectric material portion 65, wherein a first one of the pillar-shaped contact-opening assemblies 80 comprises a first conductive plug 86 that laterally contacts a cylindrical sidewall of one of the electrically conductive layers 46 and a conductive via structure 88 that contacts a top surface of the first conductive plug 86 and vertically extending at least to a horizontal plane including a top surface of the retro-stepped dielectric material portion 65.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of three-dimensional NAND strings over the silicon substrate. At least one memory cell (comprising portion of a charge storage layer 54 at a level of an electrically conductive layer 46) in a first device level of the array of three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (comprising a the least one semiconductor device 710) for the memory device located thereon. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of three-dimensional NAND strings can comprise: a plurality of semiconductor channels (59, 60), wherein at least one end portion 60 of each of the plurality of semiconductor channels (59, 60) extends substantially perpendicular to a top surface of the substrate 8 and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 60).

Embodiments of the present disclosure provide a method of forming various types of openings through an alternating stack (32, 42) of insulating layers 32 and sacrificial material layers 42 and through a retro-stepped dielectric material portion 65 employing a single anisotropic etch process. Thus, the total processing time and the total processing cost for formation of the various types of openings can be significantly reduced compared with processing schemes that employ multiple etch processes to form different types of openings for a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers having stepped surfaces;
   memory stack structures extending through the alternating stack, wherein each of the memory stack structures comprises a vertical semiconductor channel and a vertical stack of memory elements;
   a retro-stepped dielectric material portion overlying the stepped surfaces; and
   pillar-shaped contact-opening assemblies located within a respective pillar-shaped volume vertically extending through the retro-stepped dielectric material portion and a region of the alternating stack that underlies the retro-stepped dielectric material portion,
   wherein a first one of the pillar-shaped contact-opening assemblies comprises a first conductive plug that laterally contacts a cylindrical sidewall of one of the electrically conductive layers and a conductive via structure that contacts a top surface of the first conductive plug and vertically extends at least to a horizontal plane including a top surface of the retro-stepped dielectric material portion; and
   wherein the first one of the pillar-shaped contact-opening assemblies comprises a first encapsulated cavity that underlies the first conductive plug and is free of any solid phase material.

2. The three-dimensional memory device of claim 1, wherein the first one of the pillar-shaped contact-opening assemblies comprises a second conductive plug that underlies the first encapsulated cavity and laterally contacting a cylindrical sidewall of another of the electrically conductive layers.

3. The three-dimensional memory device of claim 2, wherein the second conductive plug is vertically spaced from an underlying material layer that underlies the alternating stack by a plurality of additional encapsulated cavities that are free of any solid phase material and a plurality of additional conductive plugs.

4. The three-dimensional memory device of claim 3, wherein:
   a bottommost one of the plurality of additional encapsulated cavities is bounded by and is defined by a set of surfaces including a cylindrical surface of the underlying material layer, a recessed surface of the underlying material layer adjoined to a bottom edge of the cylindrical surface, a cylindrical surface of a bottommost one of the insulating layers, and a bottom surface of bottommost one of at least one additional conductive plug that underlies the second conductive plug; and
   all encapsulated cavities except for the bottommost one of the plurality of additional encapsulated cavities is bounded by and is defined by a set of surfaces including a cylindrical surface of a respective one of the insulating layers, a bottom surface of an overlying conductive plug, and a top surface of an underlying conductive plug.

5. The three-dimensional memory device of claim 3, wherein:
   the first encapsulated cavity and the additional encapsulating cavities are not present between the memory stack structures located in a memory array region; and
   the first conductive plug comprises the topmost conductive plug in the first one of the pillar-shaped contact-opening assemblies, and the additional conductive plugs do not electrically contact the conductive via structure that contacts the top surface of the first conductive plug.

6. The three-dimensional memory device of claim 3, wherein each electrically conductive layer that underlies the one of the electrically conductive layers comprises a respective cylindrical sidewall that is contacted by a respective one of the additional conductive plugs within the first one of the pillar-shaped contact-opening assemblies.

7. A three-dimensional memory device, comprising:
   an alternating stack of insulating layers and electrically conductive layers having stepped surfaces;
   memory stack structures extending through the alternating stack, wherein each of the memory stack structures comprises a vertical semiconductor channel and a vertical stack of memory elements;
   a retro-stepped dielectric material portion overlying the stepped surfaces; and
   pillar-shaped contact-opening assemblies located within a respective pillar-shaped volume vertically extending through the retro-stepped dielectric material portion and a region of the alternating stack that underlies the retro-stepped dielectric material portion,
   wherein:
   a first one of the pillar-shaped contact-opening assemblies comprises a first conductive plug that laterally contacts a cylindrical sidewall of one of the electrically conductive layers and a conductive via structure that contacts a top surface of the first conductive plug and vertically extends at least to a horizontal plane including a top surface of the retro-stepped dielectric material portion;
   the first one of the pillar-shaped contact-opening assemblies comprises a vertically alternating stack of encapsulated cavities and additional conductive plugs;
   each of the encapsulated cavities is located at a level of a respective one of the insulating layers; and each of the additional conductive plugs is located at a level of a respective one of the electrically conductive layers.

8. A three-dimensional memory device, comprising:

an alternating stack of insulating layers and electrically conductive layers having stepped surfaces;

memory stack structures extending through the alternating stack, wherein each of the memory stack structures comprises a vertical semiconductor channel and a vertical stack of memory elements;

a retro-stepped dielectric material portion overlying the stepped surfaces; and pillar-shaped contact-opening assemblies located within a respective pillar-shaped volume vertically extending through the retro-stepped dielectric material portion and a region of the alternating stack that underlies the retro-stepped dielectric material portion, wherein:

a first one of the pillar-shaped contact-opening assemblies comprises a first conductive plug that laterally contacts a cylindrical sidewall of one of the electrically conductive layers and a conductive via structure that contacts a top surface of the first conductive plug and vertically extends at least to a horizontal plane including a top surface of the retro-stepped dielectric material portion;

each of the pillar-shaped contact-opening assemblies comprises at least one pair of a conductive plug and an encapsulated cavity arranged along a vertical direction; and a total number of the at least one pair is different among the pillar-shaped contact-opening assemblies.

9. A three-dimensional memory device, comprising:

an alternating stack of insulating layers and electrically conductive layers having stepped surfaces;

memory stack structures extending through the alternating stack, wherein each of the memory stack structures comprises a vertical semiconductor channel and a vertical stack of memory elements;

a retro-stepped dielectric material portion overlying the stepped surfaces; and pillar-shaped contact-opening assemblies located within a respective pillar-shaped volume vertically extending through the retro-stepped dielectric material portion and a region of the alternating stack that underlies the retro-stepped dielectric material portion, wherein a first one of the pillar-shaped contact-opening assemblies comprises a first conductive plug that laterally contacts a cylindrical sidewall of one of the electrically conductive layers and a conductive via structure that contacts a top surface of the first conductive plug and vertically extends at least to a horizontal plane including a top surface of the retro-stepped dielectric material portion; and wherein each of the pillar-shaped contact-opening assemblies vertically extends through a bottommost one of the electrically conductive layers, and comprises a respective conductive plug that contacts a respective cylindrical sidewall of the bottommost one of the electrically conductive layers.

\* \* \* \* \*